(12) United States Patent
Lym et al.

(10) Patent No.: US 11,257,527 B2
(45) Date of Patent: Feb. 22, 2022

(54) MEMORY MODULE WITH BATTERY AND ELECTRONIC SYSTEM HAVING THE MEMORY MODULE

(71) Applicant: SK hynix Inc., Icheon-si (KR)

(72) Inventors: Sang Kug Lym, Seoul (KR); Jong Bum Park, Seoul (KR); Kyoung Lae Cho, Seongnamsi Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/877,073

(22) Filed: May 18, 2020

(65) Prior Publication Data

US 2020/0279588 A1 Sep. 3, 2020

Related U.S. Application Data

(63) Continuation-in-part of application No. 16/560,762, filed on Sep. 4, 2019, now Pat. No. 11,056,153, which is a continuation of application No. 15/996,001, filed on Jun. 1, 2018, now Pat. No. 10,446,194, which is a continuation of application No. 14/918,734, filed on Oct. 21, 2015, now Pat. No. 10,014,032.

(30) Foreign Application Priority Data

May 6, 2015 (KR) .................... 10-2015-0062961

(51) Int. Cl.
*G11C 5/14* (2006.01)
*G11C 5/04* (2006.01)

(52) U.S. Cl.
CPC ............... *G11C 5/141* (2013.01); *G11C 5/04* (2013.01)

(58) Field of Classification Search
CPC ........... G11C 5/141; G11C 5/04; G06F 12/02; G06F 12/06; G06F 13/16; G06F 13/28; G06F 13/36; G06F 13/40; G06F 13/42; G06F 1/18; G06F 3/06; G06F 3/0613
USPC ........................................................ 365/52
See application file for complete search history.

(56) References Cited

U.S. PATENT DOCUMENTS

| | | | |
|---|---|---|---|
| 4,965,828 A | 10/1990 | Ergott, Jr. et al. | |
| 5,189,598 A | 2/1993 | Bolan et al. | |
| 5,297,099 A | 3/1994 | Bolan et al. | |
| 5,708,287 A | 1/1998 | Nakagawa et al. | |
| 5,708,297 A | 1/1998 | Clayton | |
| 5,835,733 A | 11/1998 | Walsh et al. | |
| 6,201,695 B1 | 3/2001 | Duesman et al. | |
| 6,469,474 B2 | 10/2002 | Bunker | |
| 6,693,840 B2 * | 2/2004 | Shimada | G11C 14/00 365/228 |
| 7,724,604 B2 * | 5/2010 | Amidi | G11C 11/406 365/229 |

(Continued)

OTHER PUBLICATIONS

Micron Technologies, 288-Pin DDR4 Nonvolatile RDIMM Features, "DDR4 SDRAM NVRDIMM", Apr. 9, 2010, pp. 1-25, Micron Technology Inc.

*Primary Examiner* — Son L Mai
(74) *Attorney, Agent, or Firm* — William Park & Associates Ltd.

(57) ABSTRACT

A memory module may include: a battery; a plurality of devices including a first memory, a second memory, and a controller; and a power management integrated circuit configured to adjust a level of a battery power, received from the battery, and configured to supply a power supply voltage to each of the plurality of devices.

31 Claims, 23 Drawing Sheets

(56) References Cited

U.S. PATENT DOCUMENTS

| | | | |
|---|---|---|---|
| 7,865,679 B2* | 1/2011 | Sartore | G06F 12/0638 |
| | | | 711/162 |
| 8,018,723 B1 | 9/2011 | Yu et al. | |
| 8,118,483 B2 | 2/2012 | Cox | |
| 8,154,258 B2 | 4/2012 | Pappas et al. | |
| 8,154,259 B2* | 4/2012 | Sartore | G11C 16/30 |
| | | | 320/167 |
| 8,270,226 B2 | 9/2012 | Choi et al. | |
| 8,301,833 B1* | 10/2012 | Chen | G11C 11/005 |
| | | | 711/104 |
| 8,583,869 B2 | 11/2013 | Hinkle et al. | |
| 8,725,946 B2 | 5/2014 | Petersen et al. | |
| 8,885,334 B1 | 11/2014 | Baxter | |
| 8,897,091 B1 | 11/2014 | Burstein et al. | |
| 8,930,647 B1 | 1/2015 | Smith | |
| 9,348,539 B1 | 5/2016 | Saxena et al. | |
| 9,372,759 B2* | 6/2016 | Zheng | G06F 11/1456 |
| 9,529,543 B1 | 12/2016 | Vidyapoornachary et al. | |
| 9,704,545 B2* | 7/2017 | Yu | G11C 7/08 |
| 10,108,250 B2* | 10/2018 | Kim | G11C 11/4074 |
| 10,163,508 B2* | 12/2018 | Han | G11C 11/005 |
| 11,082,043 B2* | 8/2021 | Choi | H03K 19/0005 |
| 2002/0006032 A1 | 1/2002 | Karabatsos | |
| 2002/0056018 A1 | 5/2002 | Schumacher et al. | |
| 2003/0089978 A1 | 5/2003 | Miyamoto et al. | |
| 2003/0090879 A1 | 5/2003 | Doblar et al. | |
| 2006/0198238 A1 | 9/2006 | Partridge et al. | |
| 2007/0211426 A1 | 9/2007 | Clayton et al. | |
| 2007/0212920 A1 | 9/2007 | Clayton et al. | |
| 2008/0123300 A1 | 5/2008 | Tian et al. | |
| 2010/0005212 A1 | 1/2010 | Gower et al. | |
| 2010/0008175 A1 | 1/2010 | Sweere et al. | |
| 2010/0027220 A1 | 2/2010 | Hughes et al. | |
| 2010/0095048 A1 | 4/2010 | Bechtolsheim et al. | |
| 2010/0146333 A1 | 6/2010 | Yong et al. | |
| 2011/0053391 A1 | 3/2011 | Vrenna et al. | |
| 2011/0153903 A1 | 6/2011 | Hinkle et al. | |
| 2011/0320690 A1 | 12/2011 | Petersen et al. | |
| 2012/0062187 A1 | 3/2012 | Shim | |
| 2013/0086309 A1 | 4/2013 | Lee et al. | |
| 2013/0186595 A1 | 7/2013 | Hsieh | |
| 2013/0262956 A1 | 10/2013 | Haywood et al. | |
| 2014/0022733 A1 | 1/2014 | Lim et al. | |
| 2014/0032984 A1 | 1/2014 | Lee et al. | |
| 2014/0098480 A1 | 4/2014 | Foster et al. | |
| 2014/0146461 A1 | 5/2014 | Choi et al. | |
| 2015/0181746 A1 | 6/2015 | Mullen et al. | |
| 2015/0261265 A1 | 9/2015 | Dean et al. | |
| 2015/0261446 A1 | 9/2015 | Lee | |
| 2015/0279463 A1 | 10/2015 | Berke | |
| 2015/0310898 A1 | 10/2015 | Takefman et al. | |
| 2015/0378808 A1 | 12/2015 | Kumar et al. | |
| 2016/0065000 A1 | 3/2016 | Maeda | |
| 2016/0254031 A1 | 9/2016 | Noguchi et al. | |
| 2016/0342487 A1 | 11/2016 | Ware et al. | |
| 2017/0060706 A1 | 3/2017 | Kinoshita | |
| 2017/0286285 A1 | 10/2017 | Berke et al. | |
| 2019/0243721 A1* | 8/2019 | Fox | G06F 11/1458 |
| 2020/0278736 A1* | 9/2020 | Ross | G06F 1/3275 |
| 2020/0335140 A1 | 10/2020 | Kwon et al. | |

* cited by examiner

FIG.12

| First Memory# | CMD | Output of PMIC |
|---|---|---|
| 1 | Memory<1> | VDD1 |
| 2 | Memory<2> | VDD2 |
| ⋮ | ⋮ | ⋮ |
| k | Memory<k> | VDDk |

FIG.16

| First Memory# | T > Tref | | T ≤ Tref | |
|---|---|---|---|---|
| | CMD | Output of PMIC | CMD | Output of PMIC |
| 1 | Memory<1H> | VDD11 | Memory<1L> | VDD12 |
| 2 | Memory<2H> | VDD21 | Memory<2L> | VDD22 |
| ⋮ | ⋮ | ⋮ | ⋮ | ⋮ |
| k | Memory<kH> | VDDk1 | Memory<kL> | VDDk2 |

MEMORY MODULE WITH BATTERY AND ELECTRONIC SYSTEM HAVING THE MEMORY MODULE

This application is a continuation-in-part of U.S. application Ser. No. 16/560,762, flied on Sep. 4, 2019, which is a continuation of U.S. application Ser. No. 15/996,001 flied on Jun. 1, 2018, which is a continuation of U.S. application Ser. No. 14/918,734 flied on Oct. 21, 2015, which claims priority under 35 USC § 119 to Korean Patent Application No. 10-2015-0062961 filed on May 6, 2015, in the Korean Intellectual Property Office, the disclosures of which are incorporated herein in their entirety by reference.

BACKGROUND

1. Technical Field

Various embodiments generally relate to a memory module and an electronic system, and more particularly to a memory module having batteries and an electronic system having the memory module.

2. Related Art

A computer system (e.g., server computer system and client computer system) may include a CPU, memory modules, and other electronic components (e.g., hard disks, graphic devices, passive elements, and power supply devices). The memory module is an electronic component that includes one or more semiconductor memory chips mounted on a printed circuit board. Examples of the memory module include a DRAM Dual In-line Memory Module (hereinafter referred to as "DIMM") in which a plurality of DRAMs and a plurality of memory controllers for controlling the operations of the DRAMs are mounted on a printed circuit board having signal lines for data transmission between the memory controllers and the DRAMs.

A Non-Volatile Dual In-line Memory Module (hereinafter referred to as "NVDIMM") is a DIMM that retains data even in the absence of power supply. Examples of the NVDIMMs may include an NVDIMM that is built with both DRAMs and Flash Memories. This type of NVDIMM may be used in a server computer system to enable its system memory to be persistent in the event of power failure.

The NVDIMM may include volatile memories (e.g., DRAMs) and nonvolatile memories (e.g., NAND Flash Memories) mounted together with an NVDIMM controller on a printed circuit board. Under normal power conditions, the NVDIMM operates like a regular DRAM module. It differs from a regular module, however, because it is transfers data between the DRAMs and Flash Memories to save data from the DRAM to the Flash Memories and restore the date from the Flash Memories to the DRAM.

A server computer system including the NVDIMM may also include batteries mounted on a main system board. In the case of power failure, the NVDIMM operates using the batteries, the super capacitor of which stores power during a normal state.

While not shown, such batteries mounted on the main system board of the server computer system may have one or more types of an HDD type A, a PCI card type B, and a custom type C.

SUMMARY

In an embodiment, a memory module may include: a battery; a plurality of devices including a first memory, a second memory, and a controller; and a power management integrated circuit configured to adjust a level of a battery power, received from the battery, and configured to supply a power supply voltage to each of the plurality of devices.

In an embodiment, an electronic system may include: a module controller; and a memory module. The memory module may include: a battery; a plurality of devices including a first memory, a second memory, and a controller; and a power management integrated circuit configured to adjust a level of a battery power, received from the battery, and configured to supply a power supply voltage to each of the plurality of devices.

In an embodiment, a memory module may include: a battery; a plurality of devices including a plurality of first memories, a second memory, and a controller; and a power management integrated circuit. The power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for memories.

In an embodiment, an electronic system may include: a module controller; and a memory module. The memory module may include: a battery; a plurality of devices including a plurality of first memories, a second memory, and a controller; and a power management integrated circuit. The power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for memories.

In an embodiment, a memory module may include: a battery; a plurality of devices including a plurality of first memories, a second memory, and a controller; a temperature sensor configured to measure a temperature of the memory module; and a power management integrated circuit. The power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for temperatures and memories.

In an embodiment, an electronic system may include: a memory module; and a module controller. The memory module comprising: a battery; a plurality of devices including a plurality of first memories, a second memory, and a controller; a temperature sensor configured to measure a temperature of the memory module; and a power management integrated circuit. The power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for temperatures and memories.

In an embodiment, a memory module may include: a battery; a plurality of devices including a plurality of memories and a controller, wherein the plurality of memories includes a plurality of first memories and a second memory; and at least one temperature sensor configured to measure a temperature of the devices. At least one of an operating speed, an operating time, and an operating period of at least one of the plurality of memories is adjusted based on the temperature of the devices, measured by the temperature sensor.

In an embodiment, an electronic system may include: a memory module; and a module controller. The memory module comprising: a battery; a plurality of devices including a plurality of memories and a controller, wherein the plurality of memories includes a plurality of first memories and a second memory; and at least one temperature sensor configured to measure a temperature of the devices. At least one of an operating speed, an operating time, and an operating period of at least one of the plurality of memories is adjusted based on the temperature of the devices, measured by the temperature sensor.

BRIEF DESCRIPTION OF THE DRAWINGS

FIG. 12 is a table illustrating a representation of an example of optimal power supply voltages for memories used in the embodiments of the disclosure.

FIG. 16 is a table illustrating a representation of an example of optimal power supply voltages for temperatures and memories used in the embodiments of the disclosure.

DETAILED DESCRIPTION

Figure 1:
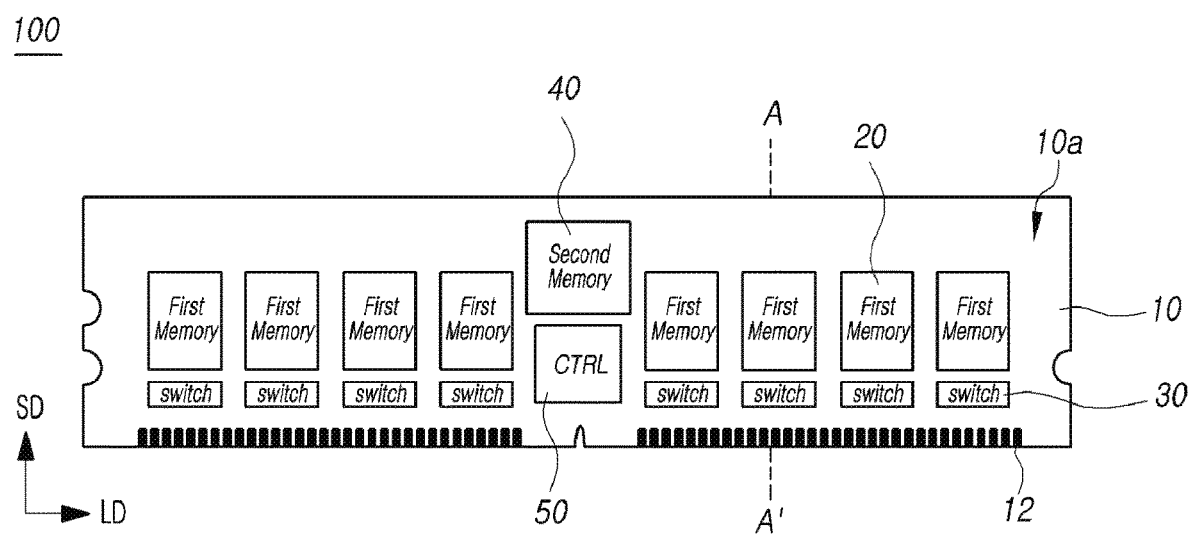
FIGS. 1 and 2 are examples of a front view and a rear view illustrating a memory module in accordance with an embodiment.

Hereinafter, a memory module including batteries will be described below with reference to the accompanying drawings through various examples of embodiments.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
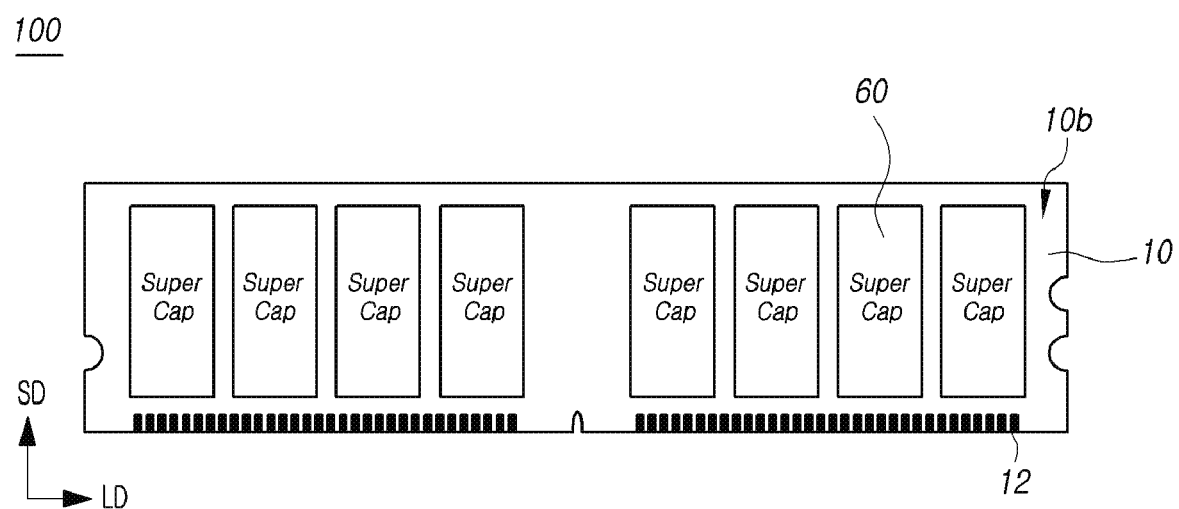
Figure 3:
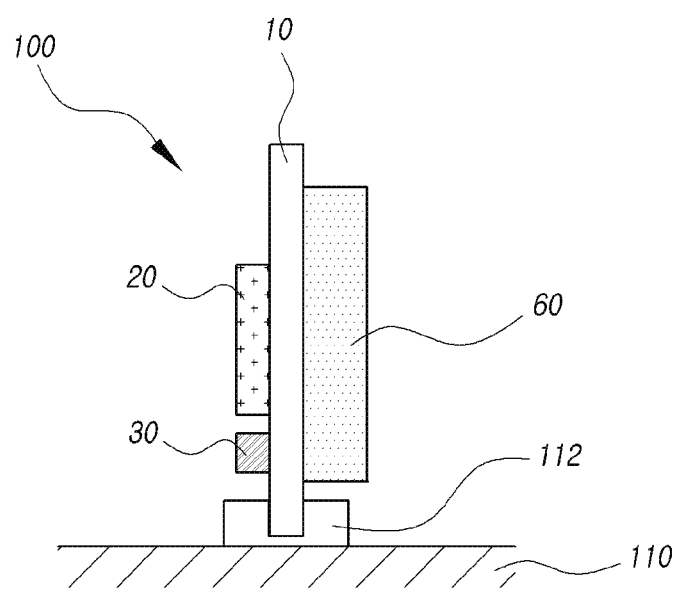
FIGS. 3 and 4 are examples of cross-sectional views taken along the line A-A' of FIG. 1, illustrating how the memory module may be mounted on a main system board in accordance with an embodiment.
Figure 4:
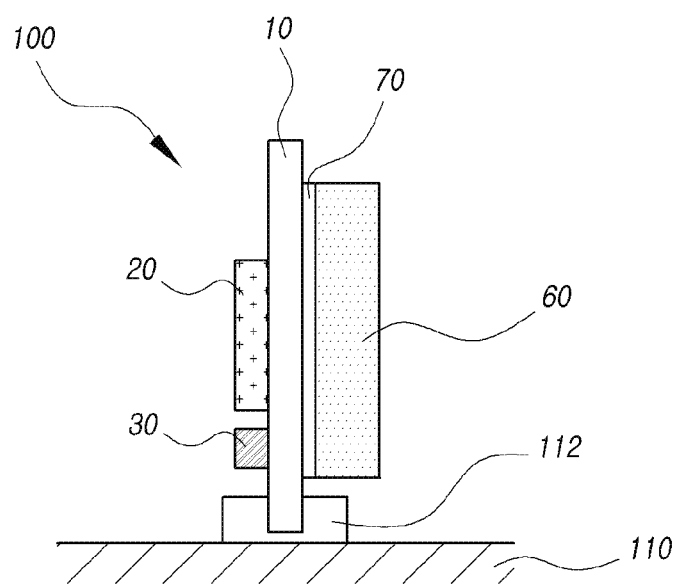

FIGS. 1 and 2 are examples of a front view and a rear view illustrating a memory module in accordance with an embodiment, and FIGS. 3 and 4 are examples of cross-sectional views taken along the line A-A' of FIG. 1, illustrating how the memory module may be mounted on a main system board in accordance with an embodiment.

Referring to FIGS. 1 to 4, a memory module 100 in accordance with an embodiment may be mounted over a main system board 110. Here, the memory module 100 may be an NVDIMM of a server computer system. The memory module 100 may include a module substrate 10, a plurality of first memories 20, switches 30, a second memory 40, a controller 50, and batteries 60.

The module substrate 10 may be a rectangular-shaped substrate that has first and second surfaces 10a and 10b facing away from each other. The module substrate 10 may have short sides along a first direction SD and long sides along a second direction LD. The module substrate 10 may include a plurality of electrode pads 12 arranged on both sides of the module substrate 10 along an edge in the second direction LD. The plurality of electrode pads 12 may fit into a socket 112 of the main system board 110 to electrically connect the module substrate 10 to the main system board 110. The module substrate 10 may have circuit patterns that are formed on the first and second surfaces 10a and 10b and vias that are formed inside the module substrate 10 for electrically connecting the circuit patterns on the first and second surfaces 10a and 10b.

The first memories 20 may include volatile memories. For instance, the first memories 20 may include DRAMs. The first memories 20 may be mounted at a predetermined interval along the second direction LD. In an embodiment, the first memories 20 are mounted on certain portions of the first surface 10a other than a center portion thereof. For example, DRAMs may be mounted on the first surface 10a of the module substrate 10 along the second direction LD such that eight DRAMs are symmetrically arranged on both sides of the center portion of the module substrate 10 at predetermined intervals.

The switches 30 may turn on/off the first memories 20 in response to control signals provided from the controller 50. The switches 30 may be mounted over the first surface 10a of the module substrate 10 such that the switches 30 are spaced predetermined distances apart from the first memories 20. The switches 30 may have a similar structure to known switches, and therefore detailed illustration and description thereof will be omitted herein.

The second memory 40 may include one or more non-volatile memories to allow the memory module 100 to retain data even in the absence of power supply. For instance, the memory module 100 may include, as the second memory 40, a NAND Flash memory mounted over the center portion of the first surface 10a. The second memory 40 may operate in response to a control signal provided from the controller 50 in the event of power failure.

The controller 50 may include an NVDIMM controller. The controller 50 may be mounted over the first surface 10a of the module substrate 10. In an embodiment, the controller 50 may be positioned at the center portion of the module substrate 10 when viewed in the second direction LD. In an embodiment, the controller 50 may be spaced apart from the second memory 40. The controller 50 may provide control signals that turn on/off the switches 30 and enable the data transmission between the first memories 20 and the second memory 40.

The batteries 60 may have a super capacitor structure to supply power to the memory module 100 in the event of power failure. The batteries 60 having the super capacitor structure may be mounted over the second surface 10b of the module substrate 10. For example, the batteries 60 having the super capacitor structure may be respectively mounted over certain portions of the second surface 10b of the module substrate 10 facing away from the portions of the first surface 10a of the module substrate 10 on which the first memories 20 and the switches 30 are mounted.

Since batteries having the super capacitor structure are sensitive to heat, the batteries 60, which are mounted on a surface facing away from the first and second memories 20 and 40, might not operate properly due to the heat generated while the first memories 20 and the second memory 40 are operating.

Therefore, as shown in FIG. 4, insulation members 70 may be interposed between the second surface 10b of the module substrate 10 and the batteries 60. The insulation members 70 may include one or more of separate insulation plates and insulation layers formed on the second surface 10b of the module substrate 10.

As described above, the memory module 100 in accordance with an embodiment may include the first memories 20, the switches 30, the second memory 40, and the controller 50 mounted on the first surface 10a of the module substrate 10, and the plurality of batteries 60 mounted on the second surface 10b of the module substrate 10.

Since the memory module 100 in accordance with an embodiment includes batteries 60 with super capacitor structure to sustain power to volatile memories in an NVDIMM, it is not necessary for a server computer system to have batteries for the NVDIMM on the main system board 110, and thus even when a number of NVDIMMs are mounted on the main system board, it is possible to efficiently utilize the space of the main system board 110.

Also, even if a server computer system has two or more NVDIMMs on its main system board, no additional batteries are required to be mounted on the main system board 110 because the memory module 100 has their own batteries 60 with super capacitor structure.

In addition, since the memory module 100 has the batteries 60 with super capacitor structure on the opposite surface of the surface where the first memories 20, the switches 30, the second memory 40, and the controller 50 are mounted, an increase in volume of the memory module 100 may be minimized, and the memory module 100 may be attached to existing sockets of the main system board 110 without increasing spaces.

Figure 5:
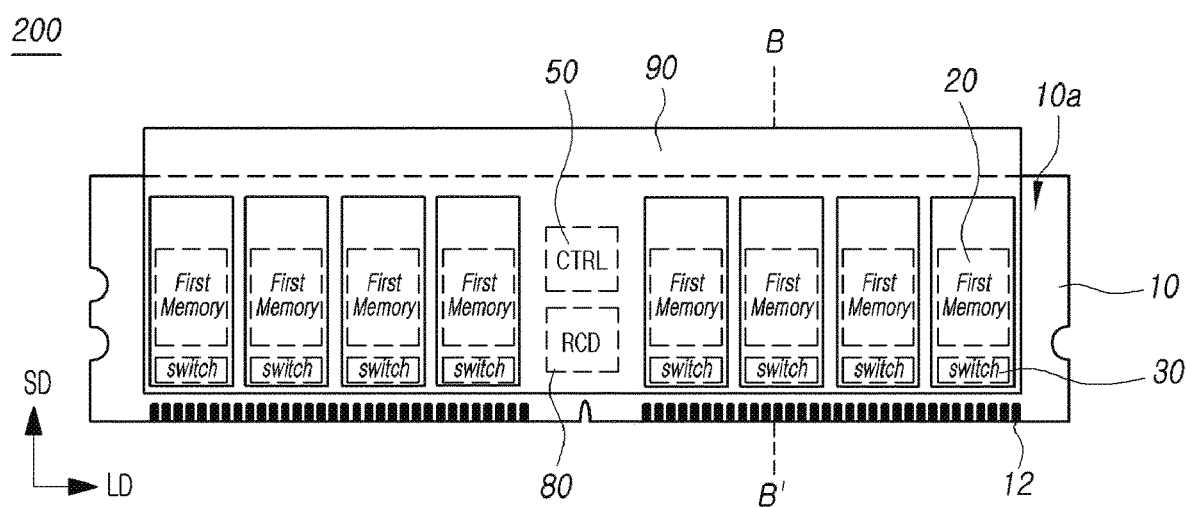
FIGS. 5 and 6 are examples of a front view and a rear view illustrating a memory module in accordance with an embodiment.
Figure 6:
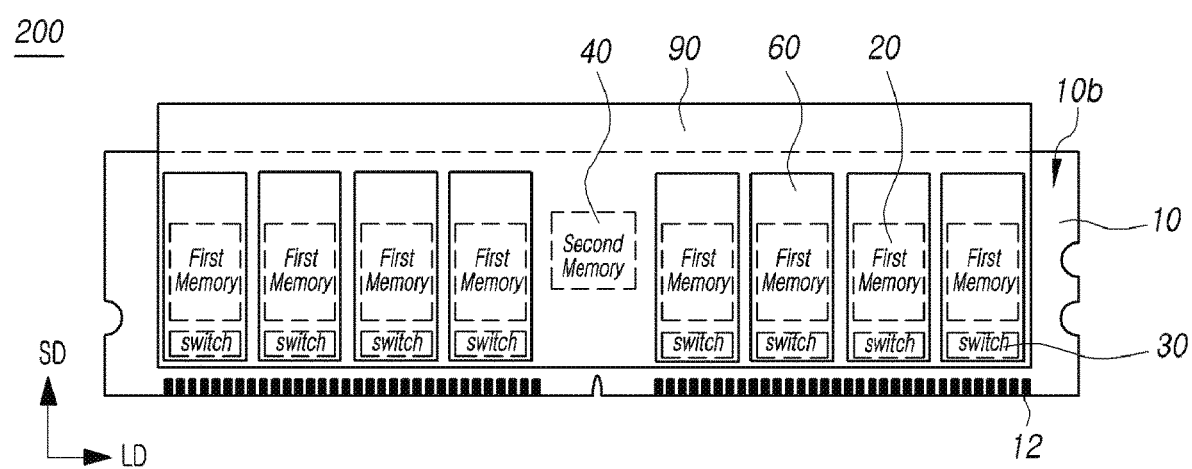
Figure 7:
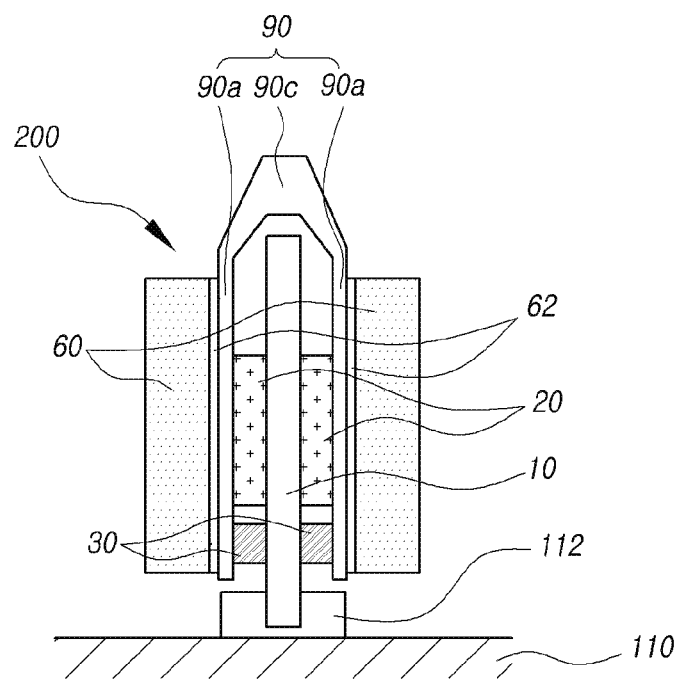
FIG. 7 is an example of a cross-sectional view taken along the line B-B' of FIG. 5, illustrating how the memory module may be mounted on a main system board in accordance with an embodiment.

FIGS. 5 and 6 are examples of a front view and a rear view illustrating a memory module in accordance with an embodiment, and FIG. 7 is an example of a cross-sectional view taken along the line B-B' of FIG. 5, illustrating how the memory module may be mounted on a main system board in accordance with an embodiment.

Referring to FIGS. 5 to 7, a memory module 200 in accordance with an embodiment may have a relatively high capacity when compared to the aforementioned embodiment.

The memory module 200 having the high capacity NVDIMM structure may include a module substrate 10, first memories 20, switches 30, a second memory 40, a controller 50, batteries 60, and a heat sink 90. The memory module 200 in accordance with an embodiment may further include a register clock driver (hereinafter referred to as "RCD") 80.

The module substrate 10 may be a rectangular-shaped substrate that has first and second surfaces 10a and 10b facing away from each other. The module substrate 10 may have short sides along a first direction SD and long sides along a second direction LD. The module substrate 10 may include circuit patterns (not shown) on the first surface 10a and the second surface 10b thereof, and vias (not shown) formed inside the module substrate 10. The module substrate 10 may include a plurality of electrode pads 12 arranged on both sides of the module substrate 10 along an edge in the second direction LD. The plurality of electrode pads 12 may fit into a socket 112 of the main system board 110.

The first memories 20 may include volatile memory devices such as DRAMs. The first memories 20 are mounted over the first and second surfaces 10a and 10b of the module substrate 10. The first memories 20 may be arranged at a predetermined interval along the second direction LD. In an embodiment, the first memories 20 are arranged on certain portions of the first and second surfaces 10a and 10b other than center portions thereof. In an embodiment, the first memories 20 may be symmetrically mounted on the first and second surfaces 10a and 10b of the module substrate 10 along the second direction LD such that eight DRAMs are symmetrically arranged on both sides of the center portions of the first and second surfaces 10a and 10b at predetermined intervals.

The switches 30 may turn on/off the first memories 20. The switches 30 may be mounted over one or more of the first and second surfaces 10a and 10b of the module substrate 10 such that the switches 30 are spaced predetermined distances apart from the first memories 20.

The second memory 40 may include one or more non-volatile memories such as Flash Memories. In an embodiment, the second memory 40 may be mounted over any one of the first and second surfaces 10a and 10b of the module substrate 10. For example, the second memory 40 may be mounted over the center portion of the second surface 10b. The second memory 40 may retain data even in the absence of power supply, and thus the first memories 20 transfer data stored therein to the second memory 40 to save data and restore the date from the second memory 40 to the first memories 20 after having recovered from a power outage.

The controller 50 may include an NVDIMM controller. The controller 50 may be mounted over the first surface 10a or the second surface 10b of the module substrate 10 at the center portion of the module substrate 10 where the second memory 40 is not mounted. The controller 50 may provide control signals to the second memory 40 to enable the data transmission between the first memories 20 and the second memory 40. Here, the first memories 20 may include DRAMs, and the second memory 40 may include a Flash Memory.

The RCD 80 may be mounted over the first surface 10a of the module substrate 10. In an embodiment, the RCD 80 may be positioned at the center portion of the first surface 10a when viewed in the second direction LD. The RCD 80 may be spaced apart from the controller 50. The RCD 80 may be similar to that of known memory module, and thus detailed description thereof will be omitted herein.

The heat sink 90 may be disposed on the first and second surfaces 10a and 10b of the module substrate 10 on which the first and second memories 20 and 40, the switches 30, the controller 50 and the RCD 80 are mounted. In an embodiment, the heat sink 90 may include a front surface portion 90a disposed on an edge portion of the first surface 10a, a rear surface portion 90b disposed on an edge portion of the second surface 10b, and a connection portion 90c, which is disposed on the opposite edge to the edge where the electrode pads are arranged and connects the front surface portion 90a and the rear surface portion 90b to each other. In an embodiment, the heat sink 90 may be formed by combining the front surface portion 90a, the rear surface portion 90b, and the connection portion 90c. In another embodiment, the heat sink 90 may be an integrated structure that has the front surface portion 90a, the rear surface portion 90b, and the connection portion 90c therein. The heat sink 90 may be installed in such a way as to be brought into contact with the first and second memories 20 and 40. As a result, the heat generated while the first and second memories 20 and 40 are driven may be dissipated through the heat sink 90.

The batteries 60 may have a super capacitor structure to supply power to the memory module 200 in the event of power failure. The batteries 60 may be mounted over certain portions of the heat sink 90 disposed on the first memories 20, which are disposed on both the first and second surfaces 10a and 10b of the module substrate 10. In an embodiment, the batteries 60 may be mounted over thermal interface materials 62 formed on the heat sink 90.

In an embodiment, since the first memories 20 (e.g., DRAMs) are mounted over both the first and second surfaces 10a and 10b of the module substrate 10, memory module 200 (e.g., NVDIMM) may have a relatively high capacity when compared to the aforementioned embodiment. Also, the heat sink 90 is additionally mounted over the first and second surfaces 10a and 10b of the module substrate 10, and thus the chances of an error occurring due to heat generation may decrease.

In addition, since the memory module 200 in accordance with an embodiment include a plurality of batteries having a super capacitor structure to sustain power to volatile memories in the memory module 200, no additional batteries are required to be mounted over the main system board because each memory module 200 has their own batteries 60 with super capacitor structure, and thus it is possible to efficiently utilize the space of the main system board.

Figure 8:
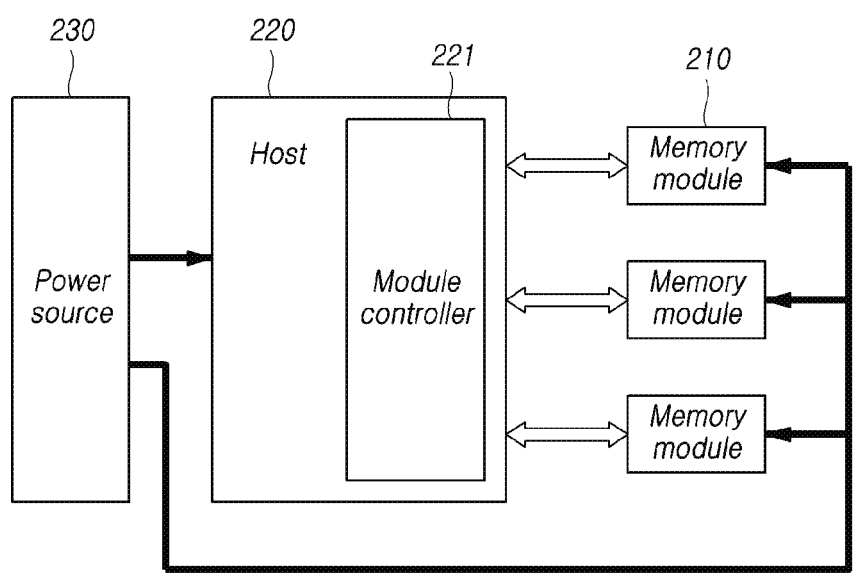
FIG. 8 is a schematic block diagram illustrating a representation of an example of an electronic system in accordance with an embodiment.

FIG. 8 is a schematic block diagram, illustrating a representation of an example of an electronic system, in accordance with an embodiment.

Referring to FIG. 8, the electronic system may include a plurality of memory modules 210, a host 220, and a power source 230. The plurality of memory modules 210, the host 220, and the power source 230 may be mounted on a main system board. A memory module of the plurality of memory modules 210 may include every function and element that is included in the memory module 100 in FIG. 1 thru FIG. 4 and the memory module 200 in FIG. 5 thru FIG. 7. The power source 230 may include one or more power connectors or one or more power management integrated circuits (PMIC) or a combination thereof. The electronic system, illustrated in FIG. 8, may correspond to, for example, a server computer system or a mobile system.

The host 220 may include a module controller 221. The module controller 221 may access the memory modules 210 and may write data to the memory modules 210 or read data from the memory modules 210. The module controller 221 may interface with the memory modules 210 and may provide various commands and addresses to the memory modules 210. The various commands and addresses may be related to operations such as data write, data read, data recovery, and data refresh. The host 220 may include a processor with multiple cores, a nonvolatile memory, a volatile memory, a wireless interface, and a network interface.

The memory modules 210 may include one of or a combination of serial interfaces, such as PCIe and SATA, and an interface in the form of a parallel interface, such as a dual in-line memory module (DIMM). The memory modules 210 may be mounted in a PCIe socket, a SATA socket, or a DIMM socket, which is coupled to the host 220, and thereby, allowing for the memory modules 210 to communicate with the host 220. For example, the memory module 210 may communicate with the host 220 based on an NVMe protocol. For example, the memory module 210 may communicate with the host 220 based on an NVDIMM protocol. For example, the memory modules 210 may be configured by at least one module with a serial interface and at least one module with a parallel interface. While the present embodiment illustrates a case in which there is a plurality of memory modules 210, it is to be noted that other embodiments may include one memory module 210. For example, one memory module 210, which includes one of or a combination of a serial interface and a parallel interface, may be provided.

The power source 230 may supply voltages with adjusted levels to the memory modules 210 and the host 220. In the following drawings, a thick line has been illustrated to be distinguished from other lines, corresponding to a line which represents the flow of a voltage.

When the number of the memory modules 210 in the electronic system is large, a memory module 210 may be installed even at a position that is physically remote from the power source 230. For the case of this particular memory module 210, since the length of a power transmission path, coupling the power source 230 and the memory module 210, is longer and the loads of the power transmission path, such as resistance, capacitance, and inductance, become larger, the magnitude by which the voltage drops through the power transmission path may increase. Due to the increase in leakage current caused by an increase in speed and a problem with degradation in voltage endurance characteristic, caused by a decrease in design rule, more sophisticated voltage control for the devices in the memory module 210 may be applied.

With the increase in a case where, in one electronic system and/or one memory module 210, memories that are fabricated through different processing processes and different designs are applied or memories with different speeds are applied, the memories themselves require flexible power supply voltages. For example, when a high speed memory, which is relatively fast in speed, is placed near input/output pins of the memory module 210 and a low speed memory, which is relatively slow in speed but is relatively reliable, is placed away from the input/output pins of the memory module 210, the high speed memory may need a high power supply voltage, and the low speed memory may need a low power supply voltage. A memory may be configured by one of or a combination of a volatile memory and a nonvolatile memory. A memory may be configured by a combination of that a capacity of a volatile memory is much larger than a capacity of a nonvolatile memory. A memory may be configured by a combination of that a capacity of a volatile memory is much less than a capacity of a nonvolatile memory. The volatile memory may be configured by one of or a combination of a DRAM and an SRAM. The nonvolatile memory may be configured by one of or a combination of a NAND flash memory, a PCRAM and an MRAM.

Embodiments, which will be described below, may suggest ways to satisfy the above-described requirements.

Figure 9:
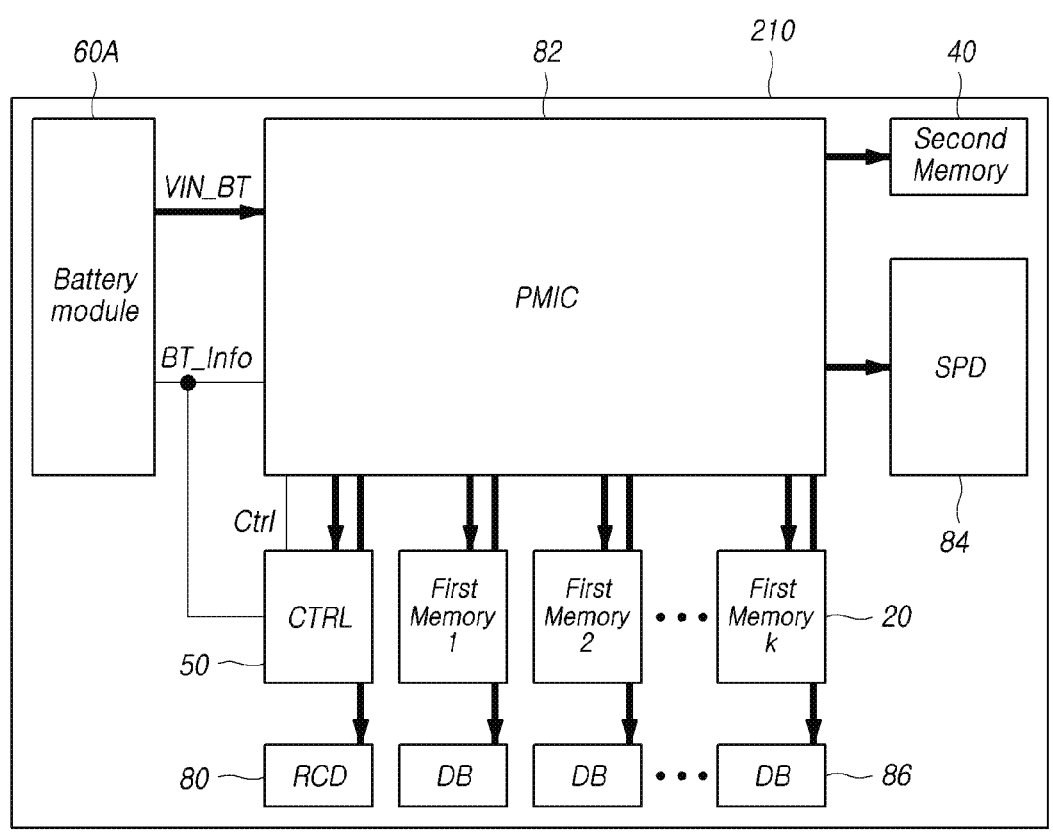
FIG. 9 is a block diagram illustrating a representation of an example of a memory module in accordance with an embodiment.

FIG. 9 is a block diagram, illustrating a representation of an example of the memory module 210, in accordance with an embodiment.

Referring to FIG. 9, the memory module 210 may include a plurality of first memories 20, a second memory 40, a controller 50, a battery module 60A, and a power management integrated circuit (PMIC) 82. Besides, the memory module 210 may further include at least one of an RCD (register clock driver) 80, an SPD (serial presence detector) 84, and DBs (date buffers) 86. The first memories 20, the second memory 40, the controller 50, the battery module 60A, the RCD 80, the PMIC 82, the SPD 84, and the DBs 86 may be mounted on a single module substrate. The first memories 20, the second memory 40, the controller 50, the battery module 60A, the RCD 80, the PMIC 82, the SPD 84, and the DBs 86 may be mounted on both-sides of the module substrate.

The first memories 20 may include volatile memories or may include both volatile memories and nonvolatile memories. The second memory 40 may include a nonvolatile memory. The first memories 20 may be used as cache memories, and the second memory 40 may be used as a main memory. Hereafter, it may be described as an example that the first memories 20 are DRAMs, and the second memory 40 is a NAND flash memory (NAND). Furthermore, it may be described as an example that the first memories 20 are DRAMs, and the second memory 40 is a MRAM. Additionally, it may be described as an example that the first memories 20 are MRAMs, and the second memory 40 is a NAND. However, this is merely an example for the sake of convenience in understanding, and it is to be noted that the scope of the disclosure is not limited thereto.

The first memories 20 and the second memory 40 may be realized as separate chips, separate packages, or the like, and may be coupled to the controller 50 through memory data bus lines.

The controller 50 may include one or more of a DRAM controller, an NVDIMM controller, a NAND controller, a PCRAM controller, and an MRAM controller. The controller 50 may receive a command and an address through the RCD 80 and may control the first memories 20 and the second memory 40 in response to the received command and address. The controller 50 may directly receive a command and an address through the RCD 80. For example, the controller 50 may control the first memories 20 and the second memory 40 such that data transaction is activated between the first memories 20 and the second memory 40.

The battery module 60A may include a rechargeable battery. For example, and the battery module 60A may have a super cap structure. The battery module 60A may be charged using a voltage, provided from the power source (230 of FIG. 8), mounted on the main system board. The battery module 60A may include a remaining battery capacity measurement device, a voltage measurement device, a current measurement device, and a temperature measurement device. The remaining battery capacity measurement device may measure the available power capacity of a battery, the voltage measurement device may measure a voltage after charging is completed or during charging, the current measurement device may measure a current after charging is completed or during charging, and the temperature measurement device may measure a temperature. The battery module 60A may provide a remaining battery capacity information signal BT_Info to the controller 50 and the PMIC 82. For example, the remaining battery capacity information signal BT_Info may be 1-bit binary data. The battery module 60A may output a logic '1' as the remaining battery capacity information signal BT_Info when the remaining battery capacity is equal to or larger than a reference capacity. Furthermore, the battery module 60A may output a logic '0' as the remaining battery capacity information signal BT_Info when the remaining battery capacity is smaller than the reference capacity. For example, the remaining battery capacity information signal BT_Info may be n-bit binary data. The battery module 60A may output the remaining battery capacity information signal BT_Info by identifying the remaining battery capacity through $2^n$ regions.

The controller 50 may determine whether the remaining battery capacity is low based on the remaining battery capacity information signal BT_Info that is received from the battery module 60A. For example, the controller 50 may determine that the remaining battery capacity is low when the remaining battery capacity information signal BT_Info that is received from the battery module 60A is a logic '0.' When it is determined that the remaining battery capacity of the battery module 60A is low, the controller 50 may control the first memories 20 and the second memory 40 to back up the data that is stored in the first memories 20 to the second memory 40. When it is determined that the remaining battery capacity is low, the controller 50 may change the memory module 210 to a power saving mode or may set the memory module 210 to be changed to the power saving mode.

The controller 50 may determine priorities of data to be backed up from the first memories 20 to the second memory 40 based on the remaining battery capacity. When a remaining battery capacity is equal to or larger than a predetermined reference, the controller 50 may back up data with the same priorities as those in a normal state. When a remaining battery capacity is smaller than the predetermined reference, the controller 50 may change priorities to be different from those in the normal state. For example, when a remaining battery capacity is smaller than the predetermined reference, priorities may be determined in the order of metadata, map data and user data. The determined priorities may be stored in the second memory 40 or SPD 84 or CTRL 50. In the case of restoring data, the controller 50 may read information on the priorities stored in the second memory 40 or SPD 84 or CTRL 50.

The RCD 80 may include a signal input unit, a signal change unit, a signal output unit, and a signal storage unit. The signal input unit may receive a command and an address from the module controller (221 of FIG. 8), the signal storage unit may buffer the received command and address, and the signal output unit may transfer the buffered command and address to the controller 50. The signal change unit may change a signal which is buffered in the signal storage unit.

The SPD 84 may include an electrically erasable programmable read-only memory (EEPROM). The SPD 84 may include initial information and/or device information of the memory module 210. The device information may include information on the shape, the configuration, the storage capacity, the type, the execution environment, the manufacturer, and so forth of the memory module 210. When the electronic system in which the memory module 210 is included is initialized or booted, the module controller (221 of FIG. 8) may read the information that is stored in the SPD 84 and may recognize and control the memory module 210 based on the read information.

The DBs 86 may receive data from the first memories 20 through memory data bus lines and may provide the received data to the module controller (221 of FIG. 8). The DBs 86 may receive data from the first memories 20 through memory data bus lines, and may provide the received data to the host (220 of FIG. 8). The DBs 86 may provide data, received from the module controller (221 of FIG. 8), to the first memories 20 through the memory data bus lines. The DBs 86 may provide data, received from the host (220 of FIG. 8), to the first memories 20 through the memory data bus lines.

The PMIC 82, after adjusting the level of a battery power VIN_BT that is supplied from the battery module 60A, may supply power supply voltages to the first memories 20, the second memory 40, the controller 50, the RCD 80, the SPD 84, and the DBs 86, respectively.

The PMIC 82 may determine whether the remaining battery capacity is low based on the remaining battery capacity information signal BT_Info that is received from the battery module 60A. For example, the PMIC 82 may determine that the remaining battery capacity is low when the remaining battery capacity information signal BT_Info that is received from the battery module 60A is a logic '0.' For example, the PMIC 82 may determine that the remaining battery capacity is low when the remaining battery capacity information signal BT_Info that is received from the battery module 60A is equal to or lower than a preset reference.

When it is determined that the remaining battery capacity is low, the PMIC 82 may reduce the consumption of the battery by stopping the supply of a power supply voltage to at least one of the devices in the memory module 210. For example, when it is determined that the remaining battery capacity is low, the PMIC 82 may supply power supply voltages to only devices that are related to the operation of backing up data of the first memories 20 to the second memory 40, for example the first memories 20, the second memory 40, and the controller 50, and may stop the supply of power supply voltages to devices that are unrelated with the data backup, for example the RCD 80, the SPD 84 and the DBs 86. Referring to another example, when it is determined that the remaining battery capacity is low, the PMIC 82 may supply power supply voltages to only devices that are related to data storage capability, for example the first memories 20 and the second memory 40, and may stop the supply of power supply voltages to devices that are unrelated to the data storage capability, for example the controller 50, the RCD 80, the SPD 84, and the DBs 86. In another example, when it is determined that a remaining battery capacity is low, the PMIC 82 may supply power supply voltages to only devices that are related with data storage capability, for example a portion of the first memories 20 and the second memory 40, and may stop the supply of power supply voltages to devices that are unrelated with the data storage capability, for example the other portion of the first memories 20, the controller 50, the RCD 80, the SPD 84, and the DBs 86. In yet another example, when it is determined that a remaining battery capacity is low, the PMIC 82 may stop the supply of power supply voltages to the RCD 80 and the DBs 86.

The PMIC 82 may stop the supply of the power supply voltage to at least one of the devices in the memory module 210 in response to a control signal Ctrl from the controller 50. For example, when the controller 50 performs an operation that requires only a specific device among the devices in the memory module 210, the PMIC 82 may stop the supply of power supply voltages to the other devices, except for the specific device that is required for the operation, in response to the control signal Ctrl from the controller 50. The stopping of the supply of a power supply voltage may correspond to generating no power supply voltage. The stopping of the supply of a power supply voltage may correspond to blocking or disconnecting an electrical path of the power supply voltage.

Figure 10:
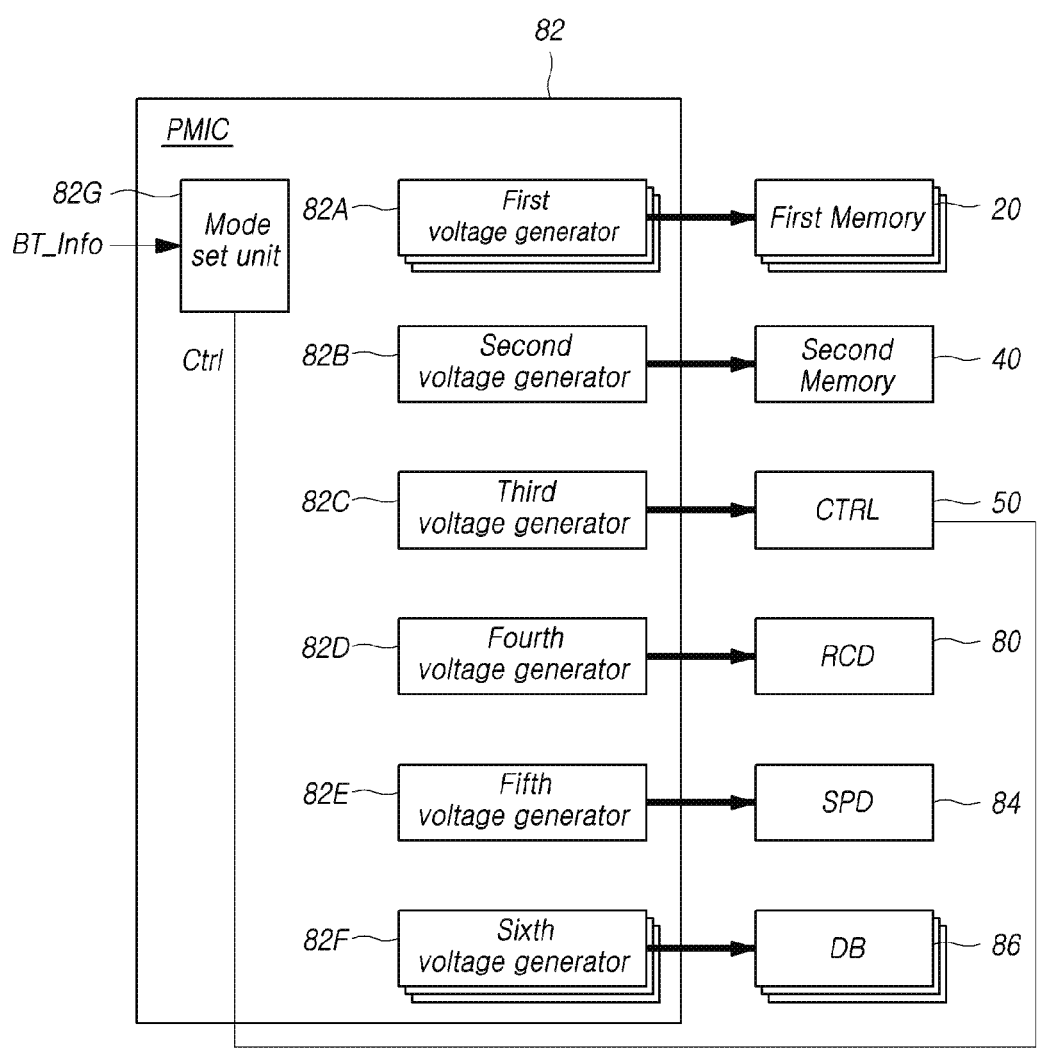
FIG. 10 is a block diagram illustrating a representation of an example of the PMIC of FIG. 9.

FIG. 10 is a block diagram, illustrating a representation of an example of the PMIC 82 of FIG. 9.

Referring to FIGS. 9 and 10, the PMIC 82 may include a plurality of voltage generators 82A to 82F and a mode set unit 82G. The voltage generators 82A to 82F may be associated with the devices in the memory module 210. That is, the voltage generators 82A to 82F may correspond to the plurality of first memories 20, the second memory 40, the controller 50, the RCD 80, the SPD 84 and the plurality of DBs 86, respectively, and may generate power supply voltages to be supplied to the associated devices and may adjust the levels of the power supply voltages, respectively.

In detail, the first voltage generator 82A, associated with one of the first memories 20, may generate a first power supply voltage to be supplied to the one first memory 20 and may adjust the level of the first power supply voltage. The second voltage generator 82B, associated with the second memory 40, may generate a second power supply voltage to be supplied to the second memory 40 and may adjust the level of the second power supply voltage. The voltage generators 82C to 82F, associated with controller 50, the RCD 80, the SPD 84 and the DBs 86, respectively, may also generate voltages and may adjust the levels of the voltages. Generating supply voltage involves transferring with significantly changing voltage, combining multiple voltages into one voltage, or dividing one voltage into multiple voltages. Adjusting the level of the power supply voltages involves increasing, decreasing, or holding the level of the power supply voltage with a slight change.

The mode set unit 82G may set modes of the respective voltage generators 82A to 82F based on the remaining battery capacity information signal BT_Info that is received from the battery module 60A. Each voltage generator may be set to an active mode, a sleep mode, or an off mode.

In detail, the mode set unit 82G may determine whether a remaining battery capacity is low based on the remaining battery capacity information signal BT_Info that is received from the battery module 60A. When it is determined that a remaining battery capacity is low, in order that voltage generators which supply power supply voltages to devices that are unrelated to the operation of backing up data of the first memories 20 to the second memory 40 use a reduced amount of the battery power VIN_BT or do not use the battery power VIN_BT, the mode set unit 82G may set or change the voltage generators which supply the power supply voltages to the devices unrelated with the data backup, to a sleep mode or an off mode.

When it is determined that the remaining battery capacity is low, in order that voltage generators which supply power supply voltages to devices that are unrelated to data storage capability use a reduced amount of the battery power VIN_BT or do not use the battery power VIN_BT, the mode set unit 82G may set or change the voltage generators which supply the power supply voltages to the devices unrelated with the data storage capability, to a sleep mode or an off mode.

When it is determined that a remaining battery capacity is low, in order that at least one of the voltage generators 82D and 82F which supply power supply voltages to the RCD 80 and the DBs 86 use a reduced amount of the battery power VIN_BT or does not use the battery power VIN_BT, the mode set unit 82G may set or change the at least one of the voltage generators 82D and 82F to a sleep mode or an off mode.

The mode set unit 82G may control the modes of the voltage generators 82A to 82F in response to the control signal Ctrl from the controller 50. When the controller 50 performs an operation that requires only a specific device among the devices in the memory module 210, the mode set unit 82G may set or change the voltage generators which supply the power supply voltages to the other devices except the specific device, to a sleep mode or an off mode, in order that voltage generators which supply power supply voltages to the other devices, except the specific device that is required by the controller 50, use a reduced amount of the battery power VIN_BT or do not use the battery power VIN_BT.

Figure 11:
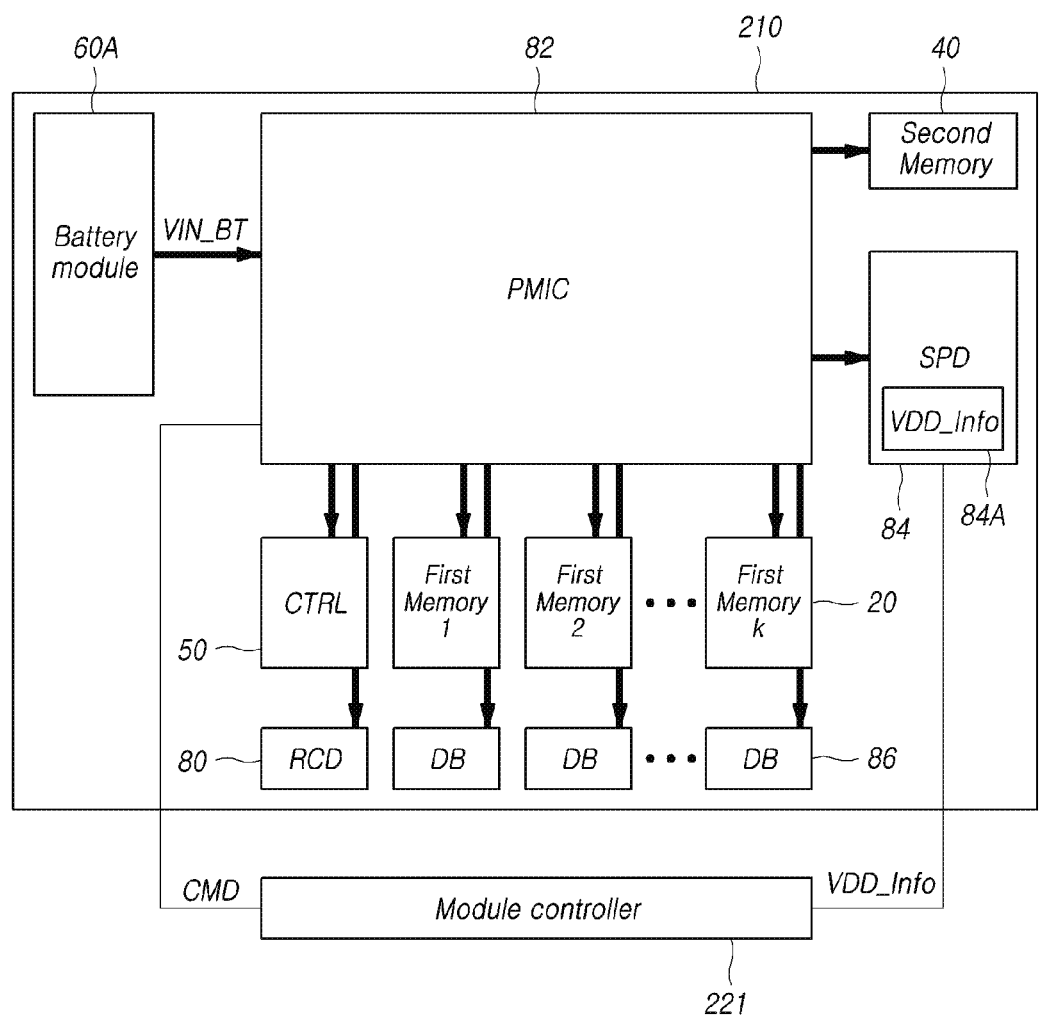
FIG. 11 is a block diagram illustrating a representation of an example of an electronic system in accordance with an embodiment.

FIG. 11 is a block diagram, illustrating a representation of an example of an electronic system, in accordance with an embodiment.

Referring to FIG. 11, the first memories 20 may be configured by DRAMs.

DRAM parameter characteristics include timing parameters, e.g., tREF, tREFI and tREFC, related to a refresh operation, a timing parameter tWR related to a write recovery operation, asynchronous timing parameters, e.g., tRCD, tRP and tAA, and synchronous timing parameters, e.g., tCK, WL (write latency), RL (read latency), and ODT.

tREF refers to a refresh period, tREFI refers to a refresh interval time, and tREFC refers to a refresh cycle time. tWR refers to a write recovery time and means the time for writing data to a memory cell.

tRCD refers to the time between application of a /RAS signal and application of a /CAS signal and means a time between a row active command and a column active command. tRP refers to a bit line precharge time, and tAA refers to a time taken from after an address is inputted to until data is outputted. tCK refers to a source clock period, WL refers to the sum of a CAS write latency and an additive latency (AL), and RL refers to the sum of a CAS latency and an additive latency (AL).

Depending on such parameter characteristics, a maximum operable speed of a DRAM may be determined. In the case of DRAMs, with excellent parameter characteristics, even when the DRAMs operate at a high speed, the functions of a DRAM memory, such as data input/output, data storage and data retention, may be stable. However, in the case of DRAMs with poor parameter characteristics, when the DRAMs operate at a high speed, a functional error may occur.

On the other hand, an operating speed of a DRAM may vary depending on the level of the power supply voltage. Even in the case of a DRAM, which has excellent parameter characteristics and is capable of operating at a high speed, when the level of the power supply voltage is low, the DRAM may operate slowly. On the other hand, in the case of a DRAM which cannot operate at a high speed (with poor characteristics), when a high power supply voltage is supplied thereto, the possibility for a functional error to occur increases. Therefore, when a power supply voltage with a high level, appropriate for a DRAM with excellent characteristics, is supplied to all the DRAMs, including a DRAM with poor characteristics, a functional error may occur, causing unnecessary power consumption. On the contrary, when a power supply voltage with a low level, appropriate for a DRAM with poor characteristics is used to prevent unnecessary power consumption, a DRAM with excellent characteristics cannot exhibit the allowable speed and allowable characteristics, which may decrease the speed and may degrade the characteristics. Therefore, in order to suppress unnecessary power consumption and improve speed and characteristics, an optimal power supply voltage may be used in consideration of parameter characteristics for an individual DRAM.

The memory module 210 may store optimal power supply voltage information VDD_Info for the respective first memories 20 (hereinafter, 'optimal power supply voltage information for memories'). The optimal power supply voltage information VDD_Info for memories, as default values that are stored as a result that is obtained through a test by a manufacturer or a vendor, may be stored, for example, in a register 84A in the SPD 84.

When the electronic system in which the memory module 210 is included is initialized or booted, the module controller 221 may read the optimal power supply voltage information VDD_Info for memories, which is stored in the SPD 84, may store the read optimal power supply voltage information VDD_Info for memories, in a register therein and may generate a command CMD based on the stored optimal power supply voltage information VDD_Info for memories.

FIG. 12 is a table, illustrating a representation of an example of optimal power supply voltages for memories that are used in the embodiments of the disclosure.

Referring to FIGS. 11 and 12, the module controller 221 may generate the command CMD based on optimal power supply voltages for memories as illustrated in FIG. 12. The command CMD may correspond to a command to adjust the level of a power supply voltage to be supplied to each first memory 20. For example, the module controller 221 may generate the command CMD as at least one among Memory<1>, Memory<2>, . . . , Memory<k>.

The PMIC 82 may generate a power supply voltage by adjusting the level of the battery power VIN_BT that is provided from the battery module 60A, based on the command CMD that is received from the module controller 221, which may allow the PMIC 82 to supply the power supply voltage to each first memory 20. For example, when the command Memory<1> is received, the PMIC 82 may generate a voltage VDD1 and supply the voltage VDD1 to the first memory 1.

Figure 13:
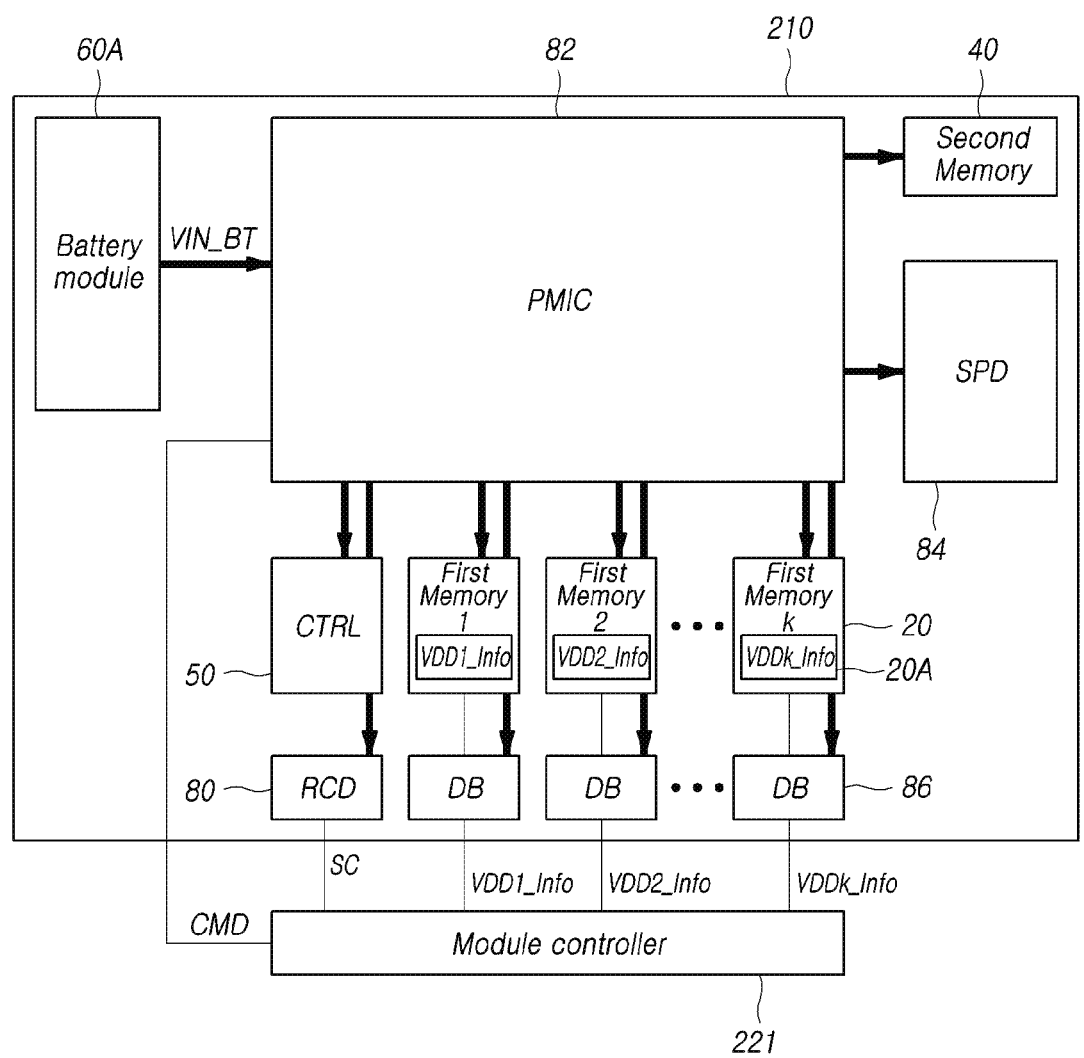
FIGS. 13 and 14 are diagrams illustrating representations of examples of modifications of the electronic system illustrated in FIG. 11.
Figure 14:
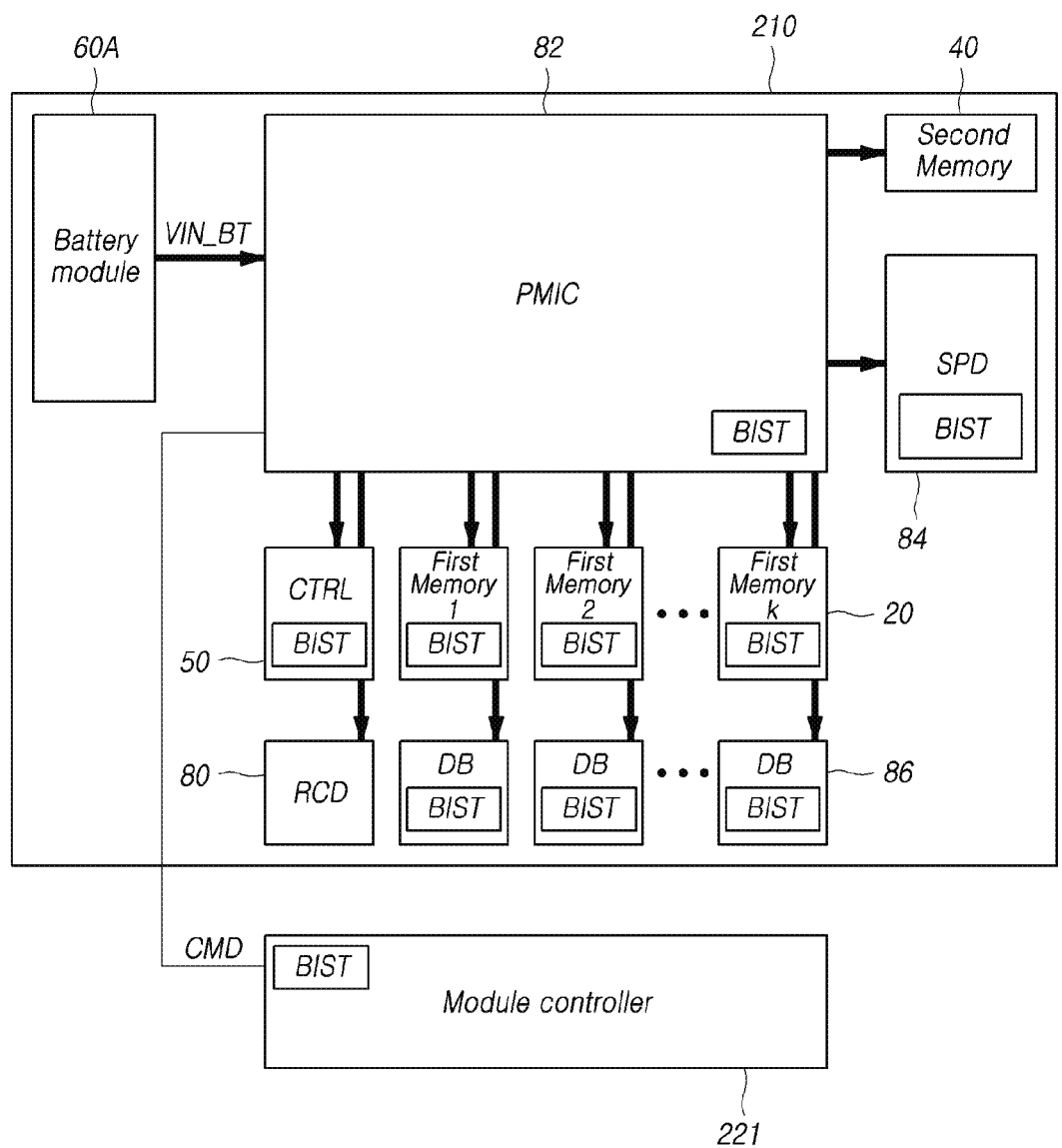

FIGS. 13 and 14 are diagrams, illustrating representations of examples of modifications of the electronic system, illustrated in FIG. 11.

Referring to FIG. 13, the first memories 20 may store their own optimal power supply voltage information VDD1_Info to VDDk_Info, respectively. The optimal power supply voltage information VDD1_Info to VDDk_Info, as default values that are stored as a result that is obtained through a test by a manufacturer or a vendor, may be stored in registers 20A in the first memories 20. The first memories 20 may be configured by one of or a combination of a volatile memory and a nonvolatile memory. The volatile memory that is used in the first memory 20 may include a device with a storage function that is similar to that of the nonvolatile memory.

When the electronic system in which the memory module 210 is included is initialized and/or booted, the module controller 221 may output a special command SC to the memory module 210 to obtain the optimal power supply voltage information VDD1_Info to VDDk_Info for memories. In response to the special command SC from the module controller 221, the memory module 210 may output the optimal power supply voltage information VDD1_Info to VDDk_Info for memories to the module controller 221. The module controller 221 may store the received optimal power supply voltage information VDD1_Info to VDDk_Info for memories, in a register therein and may generate the command CMD based on the stored information.

The PMIC 82 may generate a power supply voltage by adjusting the level of the battery power VIN_BT, provided from the battery module 60A, based on the command CMD that is received from the module controller 221, and may supply the power supply voltage to each first memory 20.

Referring to FIG. 14, the electronic system may self-test the first memories 20, installed therein, based on a system initialization command or a system booting command to obtain optimal power supply voltage information for memories. In order to support the self-test, a test circuit BIST that is used to realize a self-test algorithm may be included in each of the module controller 221 and the memory module 210. Test circuits BIST may be included in the first memories 20, the controller 50, the PMIC 82, the SPD 84, and the DBs 86, respectively, among the devices in the memory module 210.

The module controller 221 may store the optimal power supply voltage information for memories, obtained through the self-test, in a register therein and may generate the command CMD based on the stored information. The obtained optimal power supply voltage information for memories may be stored in a nonvolatile memory in the memory module 210. The obtained optimal power supply voltage information for memories may be stored in a nonvolatile memory in the module controller 221.

The PMIC 82 may generate a power supply voltage by adjusting the level of the battery power VIN_BT from the battery module 60A, based on the command CMD that is received from the module controller 221 and may supply the power supply voltage to each first memory 20.

Figure 15:
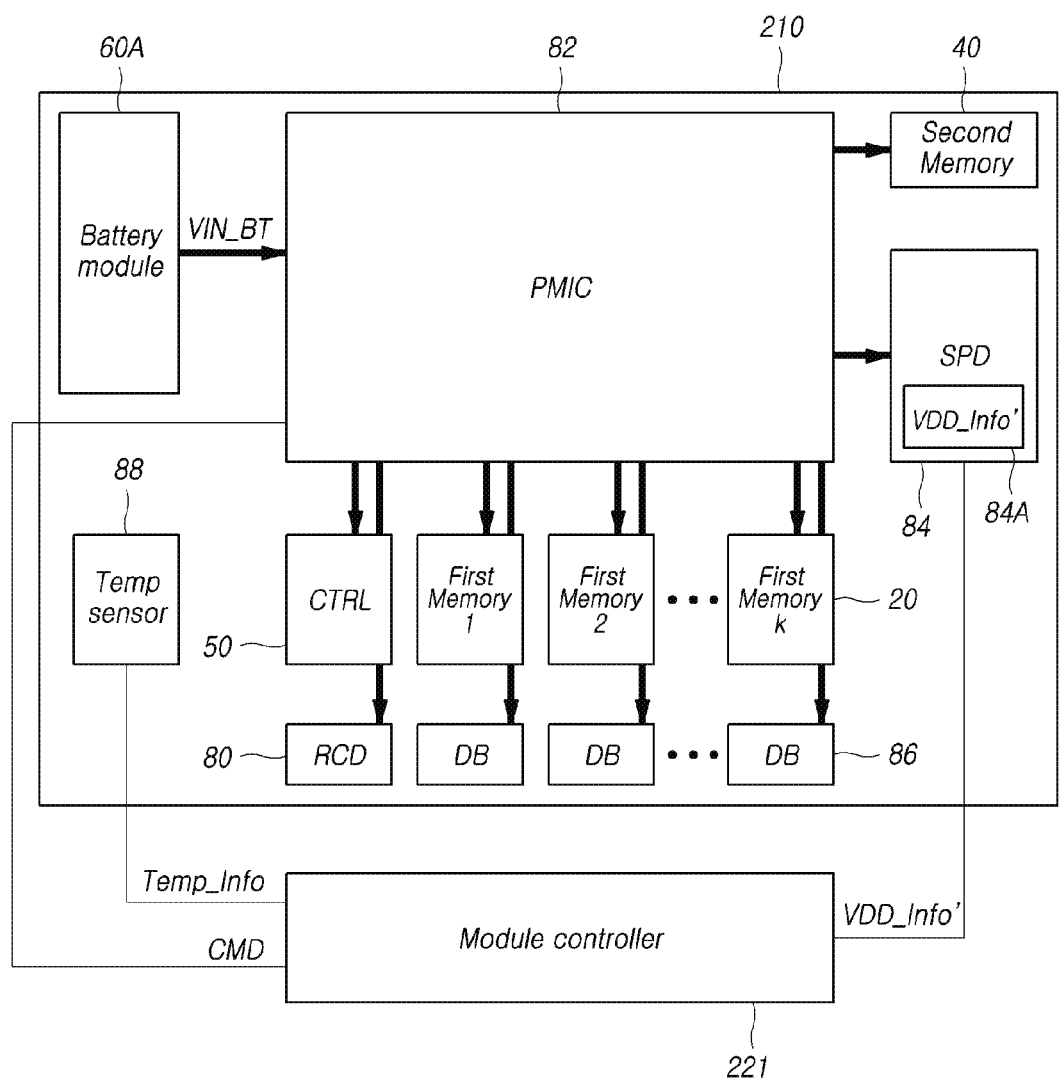
FIG. 15 is a block diagram illustrating a representation of an example of an electronic system in accordance with an embodiment of the disclosure.

FIG. 15 is a block diagram, illustrating a representation of an example of an electronic system, in accordance with an embodiment of the disclosure.

Referring to FIG. 15, the memory module 210 may include at least one temperature sensor 88 to measure the temperature of the first memories 20, the second memory 40, or the memory module 210. A temperature sensor may be included in one of the first memories. A temperature sensor may be included in the second memory. A temperature sensor may be mounted on the substrate of the memory module 210.

The temperature sensor 88 may generate temperature information Temp_Info based on a measured temperature. For example, the temperature information Temp_Info may be 1-bit binary data. The temperature sensor 88 may output a logic '1' as the temperature information Temp_Info when the measured temperature is higher than a reference temperature, and may output a logic '0' as the temperature information Temp_Info when the measured temperature is equal to or lower than the reference temperature. For example, the temperature information Temp_Info may be n-bit binary data. The temperature sensor 88 may designate and output a measured temperature as a specific value among $2^n$ values.

The module controller 221 may receive the temperature information Temp_Info from the temperature sensor 88 in real time through a signal line. The module controller 221 may compare the temperature of the first memories 20, the second memory 40, and/or the memory module 210 to the reference temperature and determine whether the temperature is higher than, equal to, or lower than the reference temperature based on the received temperature information Temp_Info.

The first memories 20 may include DRAMs. Among the above-described parameter characteristics of a DRAM, the timing parameter characteristics tREF, tREFI, and tREFC, related to a refresh operation, and the timing parameter characteristic tWR, related to a write recovery operation, may be sensitive to the change in temperature.

In detail, the charge that is stored in a cell capacitor of a DRAM may be lost over time. Significant loss of charge may cause an error when reading data from the DRAM. Therefore, a refresh operation of sensing, amplifying, and rewriting data may be performed before the charge that is stored in the cell capacitor is significantly lost. If a temperature of a DRAM rises, the speed at which the charge that is stored in the cell capacitor is lost may increase. Therefore, a refresh cycle may be performed to recover from losing the charge. Storing the charge in the cell capacitor may be related to the level of voltage and the level of current. The temperature of the DRAM may be related to the level of power supply voltage. The temperature of the DRAM may increase faster when using a higher level of power supply voltage compared to when using a lower level of power supply voltage. The temperature of the DRAM may be related to the speed of data transfer and to a clock frequency. The temperature of the DRAM, using a higher speed of data transfer, may increase faster than when using a lower speed of data transfer. As described above, the refresh cycle may vary depending on the level of the power supply voltage. The refresh cycle may be shortened when a high power supply voltage is used and may be lengthened when a low power supply voltage is used. The refresh cycle may vary depending on the speed of data transfer, being positively correlated to the clock frequency. The refresh cycle may be shortened if a high speed data transfer is used and may be lengthened if a low speed data transfer is used.

When a high power supply voltage is used, since the refresh cycle may be shortened, the loss of the charge may be suppressed, but power consumption may increase. Conversely, if a low power supply voltage is used to reduce power consumption, the refresh cycle is lengthened, and thus, the possibility for the charge to be lost increases. Therefore, in order to reduce power consumption and suppress the loss of charge, the level of a power supply voltage used in the refresh operation may be flexibly managed depending on the temperature.

On the other hand, since a resistance component in a DRAM increases as the temperature decreases, a longer time may be required to store the charge, and thus, the number of bits that fail due to a violation of the tWR specification may increase. As described above, tWR may vary depending on the level of the power supply voltage. tWR may be shortened when a high power supply voltage is used and may be lengthened when a low power supply voltage is used.

If a high power supply voltage is used, the number of tWR failure bits may be reduced since tWR is shortened, but power consumption may increase. Conversely, if a low power supply voltage is used to reduce power consumption, tWR is lengthened, and thus, the number of tWR failure bits may increase. Therefore, in order to reduce power consumption and the number of tWR failure bits, the level of a power supply voltage used in the data write operation may be flexibly managed depending on the temperature.

Referring back to FIG. 15, the memory module 210 may store optimal power supply voltage information VDD_Info' for memories depending on a temperature (hereinafter, optimal power supply voltage information for temperatures and memories). The optimal power supply voltage information VDD_Info' for temperatures and memories, as default values stored as a result obtained through a test by a manufacturer or a tester, may be stored, for example, in a register 84A in the SPD 84. For each of the refresh operation and the data write operation, the optimal power supply voltage information VDD_Info' for temperatures and memories may be provided.

FIG. 16 is a table, illustrating a representation of an example of optimal power supply voltages for temperatures and memories, used in the embodiments of the disclosure.

Referring to FIGS. 15 and 16, the optimal power supply voltage for each memory in the refresh operation may be greater when a temperature T of the memory module 210 is higher than a reference temperature Tref compared to when a temperature T of the memory module 210 is equal to or lower than the reference temperature Tref. When the table of FIG. 16 represents optimal power supply voltages used in the refresh operation, VDD11 may be larger than VDD12.

An optimal power supply voltage for each memory in the data write operation may be greater when a temperature T of the memory module 210 is equal to or lower than a reference temperature Tref compared to when a temperature T of the memory module 210 is higher than the reference temperature Tref. When the table of FIG. 16 represents optimal power supply voltages used in the data write operation, VDD12 may be larger than VDD11. The reference temperature Tref for the refresh operation and the reference temperature Tref for the data write operation may be different values.

When the electronic system in which the memory module 210 is included is initialized or booted, the module controller 221 may read the optimal power supply voltage information VDD_Info' for temperatures and memories, which is stored in the SPD 84, may store the read optimal power supply voltage information VDD_Info' for temperatures and memories, in a register therein, may generate a command CMD based on the stored optimal power supply voltage information VDD_Info' for temperatures and memories and the temperature information Temp_Info from the temperature sensor 88, and may provide the command CMD to the PMIC 82. For example, when it is determined by analyzing the temperature information Temp_Info from the temperature sensor 88 that the temperature is higher than the reference temperature Tref, the module controller 221 may output at least one command CMD among Memory<1H> to Memory<kH> to the PMIC 82. On the other hand, when it is determined that the temperature is equal to or lower than the reference temperature Tref, the module controller 221 may output at least one command CMD among Memory<1L> to Memory<kL> to the PMIC 82.

The PMIC 82 may generate a power supply voltage by adjusting the level of the battery power VIN_BT from the battery module 60A, based on the command CMD that is received from the module controller 221, and may supply the generated power supply voltage to each first memory 20. For example, when the command Memory<1H> is received, the PMIC 82 may generate the voltage VDD11 and supply the voltage VDD11 to the first memory 1.

Figure 17:
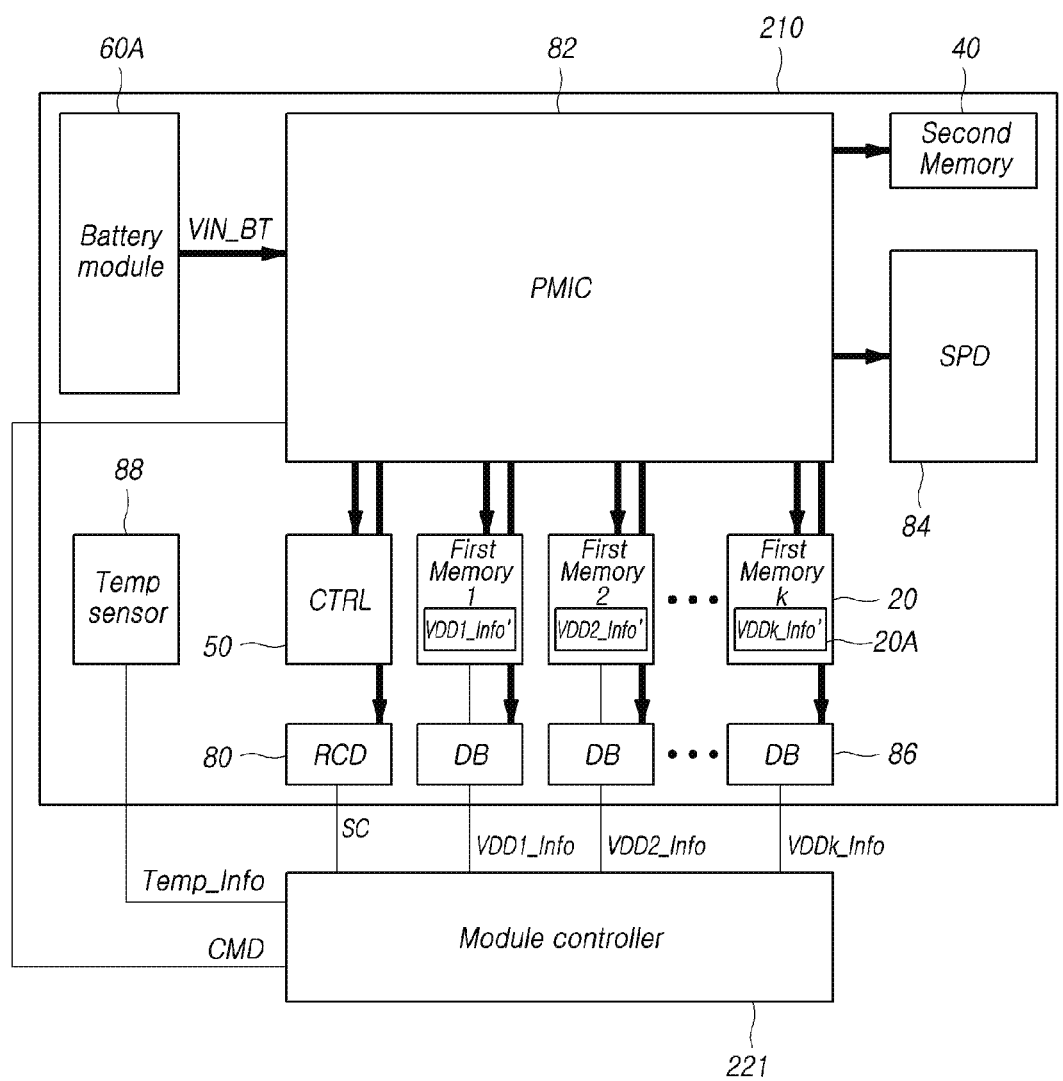
FIGS. 17 and 18 are diagrams illustrating representations of examples of modifications of the electronic system illustrated in FIG. 15.
Figure 18:
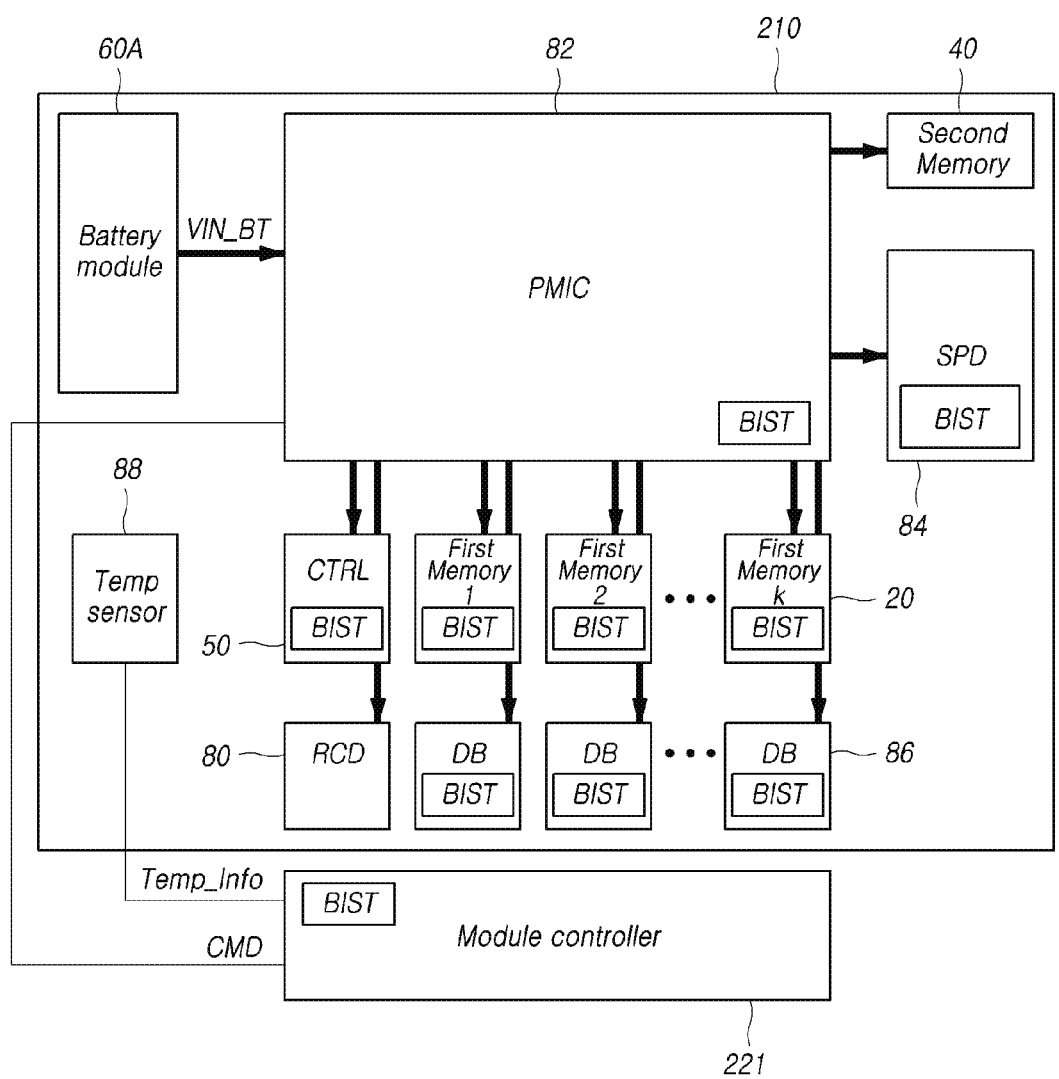

FIGS. 17 and 18 are diagrams, illustrating representations of examples of modifications of the electronic system, illustrated in FIG. 15.

Referring to FIG. 17, the first memories 20 may store their own optimal power supply voltage information VDD1_Info' to VDDk_Info', respectively, for temperatures. The optimal power supply voltage information VDD1_Info' to VDDk_Info' for temperatures and memories, as default values that are stored as a result that is obtained through a test by a manufacturer or a tester, may be stored in registers 20A in the first memories 20.

When the electronic system in which the memory module 210 is included is initialized and/or booted, the module controller 221 may output a special command SC to the memory module 210 to obtain the optimal power supply voltage information VDD1_Info' to VDDk_Info' for temperatures and memories. The memory module 210 may output the optimal power supply voltage information VDD1_Info' to VDDk_Info' for temperatures and memories, which are stored in the first memories 20, to the module controller 221 in response to the special command SC from the module controller 221. The module controller 221 may store the received optimal power supply voltage information VDD1_Info' to VDDk_Info' for temperatures and memories, in a register therein and may generate the command CMD based on the stored information.

The PMIC 82 may generate a power supply voltage by adjusting the level of the battery power VIN_BT from the battery module 60A, based on the command CMD that is received from the module controller 221, and may supply the power supply voltage to each first memory 20.

Referring to FIG. 18, the electronic system may self-test the first memories 20, installed therein, based on a system initialization command or a system booting command to obtain optimal power supply voltage information for temperatures and memories. In order to support the self-test, a test circuit BIST that is used to realize a self-test algorithm may be included in each of the module controller 221 and the memory module 210. Test circuits BIST may be included in one of or a combination of the first memories 20, the controller 50, the PMIC 82, the SPD 84, and the DBs 86, among the devices in the memory module 210.

The module controller 221 may store optimal power supply voltage information for temperatures and memories that is obtained through the self-test, in a register therein and may generate the command CMD based on the stored information. The obtained optimal power supply voltage information for temperatures and memories may be stored in a nonvolatile memory in the memory module 210.

The PMIC 82 may generate a power supply voltage by adjusting the level of the battery power VIN_BT from the battery module 60A, based on the command CMD that is received from the module controller 221, and may supply the power supply voltage to each first memory 20.

Figure 19A:
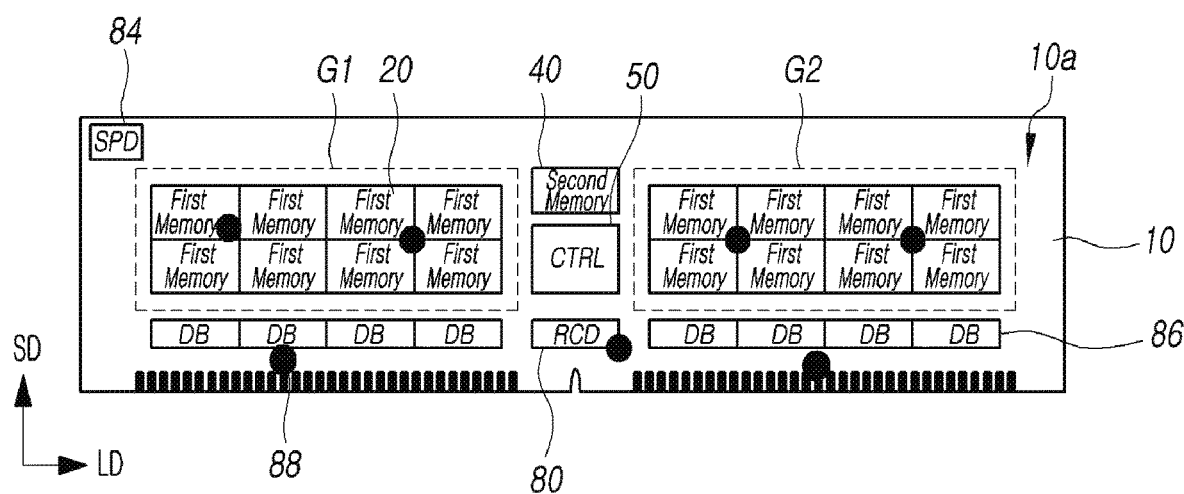
FIGS. 19A and 19B are a front view and a rear view, respectively, illustrating a representation of an example of a memory module in accordance with an embodiment of the disclosure.
Figure 19B:
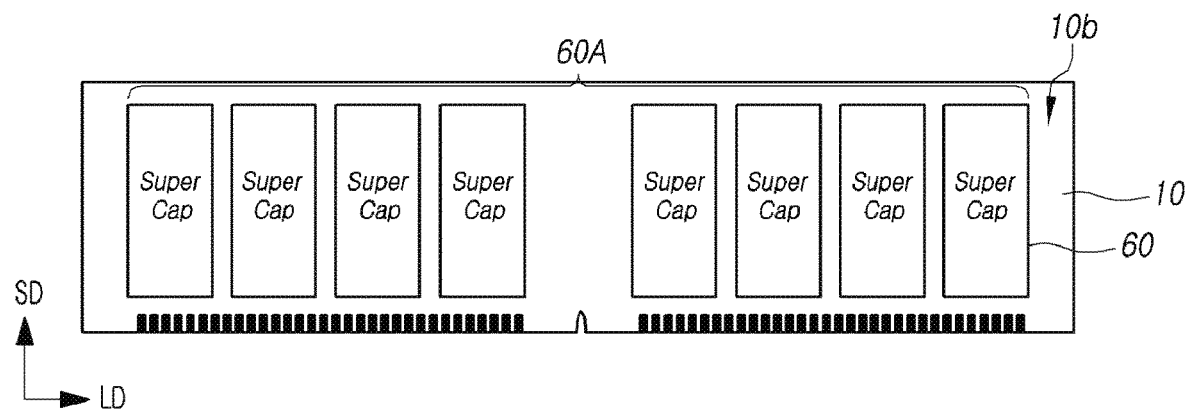
Figure 20:
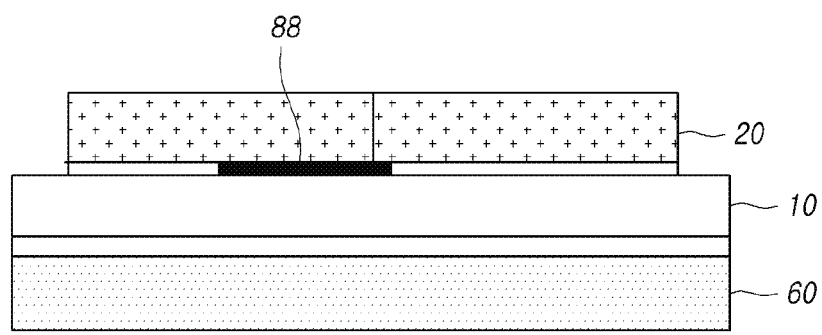
FIG. 20 a cross-sectional view illustrating a representation of an example of the memory module illustrated in FIGS. 19A and 19B.

FIGS. 19A and 19B are a front view and a rear view, respectively, illustrating a representation of an example of a memory module, in accordance with an embodiment of the disclosure, and FIG. 20 a cross-sectional view, illustrating a representation of an example of the memory module, illustrated in FIGS. 19A and 19B.

Referring to FIGS. 19A and 19B, first memories 20 may be mounted on one surface 10a of a module substrate 10, and a battery module 60A may be mounted on the other surface 10b of the module substrate 10. However, it is to be noted that the positions of the first memories 20 and the battery module 60A are not limited thereto. For example, as illustrated in FIGS. 5 to 7, the first memories 20 may be mounted on both the one surface 10a and the other surface 10b of the module substrate 10, producing a high-capacity memory. Further, batteries 60 may be mounted on some or all of the first memories 20 on both the one surface 10a and the other surface 10b of the module substrate 10 to produce the high capacity battery.

Referring to FIG. 19A, the first memories 20 may be grouped into a plurality of groups, depending on their positions. For example, first memories 20, which are positioned on a left side with respect to a middle portion of the module substrate 10 in a long side direction LD of the module substrate 10, may be included in a first group G1. The first memories 20, which are positioned on a right side with respect to the middle portion of the module substrate 10 in the long side direction LD of the module substrate 10, may be included in a second group G2.

The memory module 210 may include at least one temperature sensor 88. For example, the temperature sensor 88 may be installed at a position that is adjacent to the first memories 20 whose data storage capability changes depending on the temperature. As another example, the temperature sensor 88 may be installed in a region whose temperature is relatively higher than the other regions of the memory module 210 and/or a position adjacent to the region. For example, a region whose temperature is high may include a region where buses for data transmission are dense (and thus, changes in electrical signals per area are substantial), a main core region of a controller 50, a region where input/output terminals of the controller 50 are dense, a region where input/output terminals of DBs 86 are dense, a region where traffic frequently occurs through a bus or a region where signal routing or switching occurs. For example, the temperature sensor 88 may be installed in a region where buses for data transmission are dense. The temperature sensor 88 may be installed in a region where changes in electrical signals per area are substantial. The temperature sensor 88 may be installed in a main core region of the controller 50. The temperature sensor 88 may be installed in a region where input/output terminals of the controller 50 are dense. The temperature sensor 88 may be installed in a region where input/output terminals of the DBs 86 are dense. The temperature sensor 88 may be installed in a region where traffic frequently occurs through a bus. The temperature sensor 88 may be installed in a region where a signal routing or switching device is positioned.

As illustrated in FIG. 20, the temperature sensor 88 may be disposed between the first memories 20 and the module substrate 10. Although not illustrated, the temperature sensor 88 may be disposed between at least one of a second memory 40 and an RCD 80 and the module substrate 10.

The controller 50 may estimate the temperature of each part in the first memories 20 and/or the module substrate 10 by using interpolation and/or extrapolation based on the temperature measured by the temperature sensor 88 and a distance to the temperature sensor 88.

The memory module 210 may store the temperature information. The temperature information may be stored in a register in the RCD 80 or the SPD 84. The temperature information, stored in the memory module 210, may be provided to the controller 50 or the first memories 20 and the second memory 40. The controller 50 may control at least one of an operating speed, an operating time, and an operating period of the first memories 20 and the second memory 40 based on the received temperature information. Alternatively, each of the first memories 20 and the second memory 40 may control its own operating speed, operating time, and operating period based on the temperature information received therein.

Figure 21:
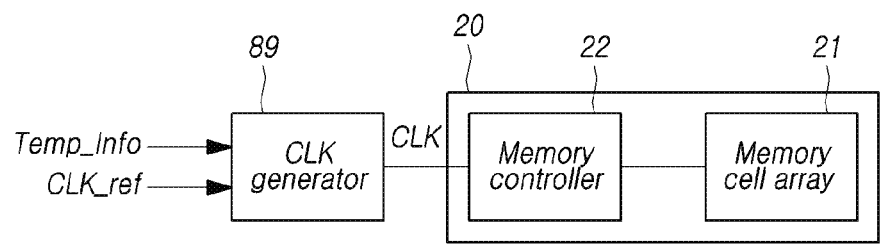
FIG. 21 is a block diagram illustrating a representation of an example of main components of a memory module in accordance with an embodiment of the disclosure.

FIG. 21 is a block diagram, illustrating a representation of an example of main components of a memory module, in accordance with an embodiment of the disclosure.

Referring to FIG. 21, the memory module may include a clock generator 89, which generates a clock CLK with varying periods based on the temperature information Temp_Info. By analyzing the temperature information Temp_Info, the clock generator 89 may generate the clock CLK with a first period when it is determined that the temperature of a first memory 20 is equal to or lower than a reference temperature. The clock generator 89 may generate the clock CLK with a second period, the second period being different from the first period, when the temperature of the first memory 20 is higher than the reference temperature.

For example, when the first memory 20 is a DRAM and the clock CLK is a clock that is used in a refresh operation, the clock generator 89 may generate the clock CLK with the first period when a temperature of the first memory 20 is equal to or lower than the reference temperature, and may generate the clock CLK with the second period, the second period being shorter than the first period, when a temperature of the first memory 20 is higher than the reference temperature.

For another example, when the first memory 20 is a DRAM and the clock CLK is a clock used in a data write operation, the clock generator 89 may generate the clock CLK with the second period when a temperature of the first memory 20 is higher than the reference temperature, and may generate the clock CLK with the first period shorter than the second period when a temperature of the first memory 20 is equal to or lower than the reference temperature.

The first memory 20 may control at least one of an operating speed, an operating time, and an operating period for a refresh/write/read/erase operation, using the clock CLK from the clock generator 89. The first memory 20 may include a memory cell array 21 and a memory controller 22. The memory controller 22 may control the refresh/write/read/erase operation by using the clock CLK from the clock generator 89. While FIG. 21 illustrates a case in which the clock generator 89 generates the clock CLK used in the first memory 20, the disclosure is not limited thereto. The clock generator 89 may generate a clock CLK used in a second memory 40.

Although the present embodiment illustrates a case in which the memory controller 22 is included in the first memory 20, the disclosure is not limited thereto. The memory controller 22 may be defined outside of the first memory 20. For example, the memory controller 22 may be included in the controller (50 of FIG. 19A). Although the present embodiment illustrates a case in which the clock generator 89 is configured separately from the first memory 20, the disclosure is not limited thereto. The clock generator 89 may be included in the first memory 20.

Figure 22:
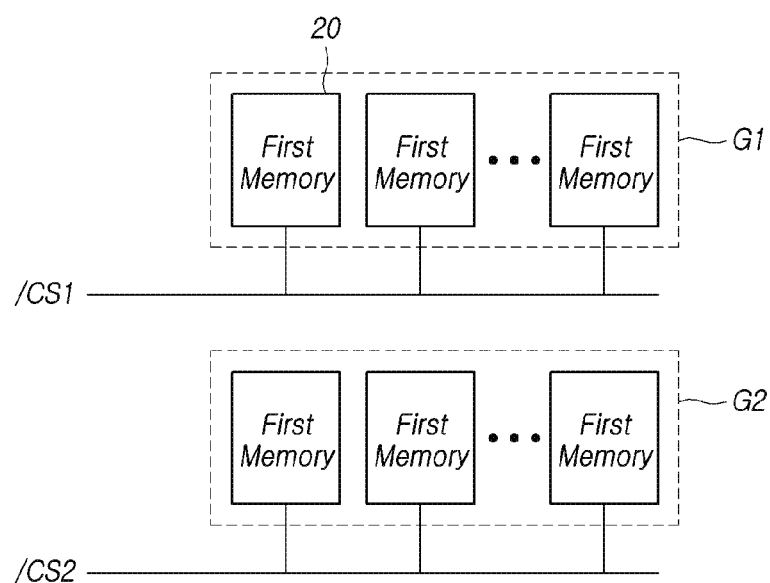
FIG. 22 is a representation of an example of a diagram to assist in the explanation of operations of first memories by rank.

FIG. 22 is a representation of an example of a diagram to assist in the explanation of operations of first memories by rank.

Referring to FIGS. 19A and 22, the first memories 20 may be coupled to a module controller (not illustrated) in a multi-group pattern. First memories 20, included in each of groups G1 and G2, may configure one rank. A rank refers to memories that are simultaneously controlled by the module controller. For example, when the module controller inputs/outputs data in 64-bit unit (x64) and each first memory 20 inputs/outputs data in 8-bit unit (x8), eight first memories 20 may configure one rank.

First memories 20, included in the same group (rank), may share a chip enable signal. For example, the first memories 20 of the first group G1 may share a first chip enable signal /CS1, and the first memories 20 of the second group G2 may share a second chip enable signal /CS2.

If the first chip enable signal /CS1 is activated to an A level, the first memories 20 of the first group G1 may be selected. If the first chip enable signal /CS1 is deactivated to a B level, the first memories 20 of the first group G1 may be set to an idle state. If the second chip enable signal /CS2 is activated to an A level, the first memories 20 of the second group G2 may be selected. If the second chip enable signal /CS2 is deactivated to a B level, the first memories 20 of the second group G2 may be set to an idle state.

The module controller may control an operation mode for each group (each rank), based on the temperature information. Heat may be generated while a DRAM operates, and, when a temperature of the memory module 210 rises above an allowable value, a function error may occur due to the high heat.

The module controller may analyze the temperature information from the temperature sensors 88 to determine whether a temperature for each group (each rank) is higher than the allowable value. The module controller may deactivate a chip enable signal to be provided to a group (rank) whose temperature is determined to be higher than the allowable value and may activate a chip enable signal to be provided to a group (rank) whose temperature is determined to be equal to or lower than the allowable value. Accordingly, since only a group (rank), which is determined to have a temperature equal to or lower than the allowable value, operates and a group (rank), which is determined to have a temperature higher than the allowable value, is set to an idle mode, the temperature of the memory module 210 may be lowered while the function of the memory module 210 may be maintained, thereby reducing functional errors.

As is apparent from the above descriptions, according to some embodiments of the disclosure, since the battery module 60A and the PMIC 82 are provided in the memory module 210, the length of the power transmission path for transferring power to the devices in the memory module 210 may be shortened. Therefore, it is possible to reduce the drop of a voltage through the power transmission path, and it is possible to provide a power supply voltage with a more stable level to the devices in the memory module 210.

According to some embodiments of the disclosure, since the supply of a power supply voltage to at least one of the devices in the memory module 210 may be stopped based on battery capacity information or an operation of the controller 50, the consumption of a battery may be reduced.

According to some embodiments of the disclosure, since the levels of power supply voltages that are supplied to the first memories 20 may be differentiated for the first memories 20 based on parameter characteristics, it is possible to suppress unnecessary power consumption due to the supply of an excessively high power supply voltage, and it is possible to increase an overall performance by controlling individually the first memories based on each parameter characteristics to permit an allowable speed and allowable characteristics.

According to some embodiments of the disclosure, since the levels of power supply voltages that are supplied to the first memories 20 may be differentiated for the first memories 20 based on a temperature, unnecessary power consumption may be suppressed, and at the same time, a refresh characteristic and a tWR characteristic as parameter characteristics, sensitive to a temperature, may be improved.

According to some embodiments of the disclosure, since first memories 20 may be selectively activated for each group (rank) based on a temperature, only a group (rank) that is determined to have a temperature equal to or lower than an allowable temperature may operate, and a group (rank) that is determined to have a temperature higher than the allowable temperature may be set to an idle mode. Therefore, the temperature of the memory module 210 may be lowered while the function of the memory module 210 is maintained, thereby reducing functional errors due to high heat.

According to some embodiments of the disclosure, since the levels of power supply voltages that are supplied to the first memories 20 may be differentiated for the first memories 20 based on the temperature and parameter characteristics, unnecessary power consumption may be suppressed, and at the same time, a refresh characteristic and a tWR characteristic as parameter characteristics sensitive to a temperature may be further improved.

The above-described exemplary embodiment of the disclosure may be embodied not only through an apparatus and method but also through a program that executes a function corresponding to a configuration of the exemplary embodiment of the disclosure or through a recording medium on which the program is recorded, and can be easily embodied by a person of ordinary skill in the art from the description of the foregoing exemplary embodiment.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory module comprising:
   a battery;
   a plurality of devices including a first memory, a second memory, and a controller; and
   a power management integrated circuit configured to adjust a level of a battery power, received from the battery, and configured to supply a power supply voltage to each of the plurality of devices,
   wherein the battery, the plurality of devices, and the power management integrated circuit are mounted on a single module substrate.

2. The memory module according to claim 1, wherein the power management integrated circuit comprises:
   a plurality of voltage generators, each corresponding to one of the plurality of devices, and each configured to adjust a level of the battery power to supply a power supply voltage to its corresponding device; and
   a mode set unit configured to set or change modes of the voltage generators to one of an active mode, a sleep mode, and an off mode.

3. The memory module according to claim 2, wherein the mode set unit is configured to set or change at least one of the plurality of voltage generators to the sleep mode or the off mode, when a remaining capacity of the battery is smaller than a reference capacity.

4. The memory module according to claim 2, wherein the mode set unit is configured to set or change at least one of the plurality of voltage generator, which supplies a power supply voltage to a device, among the plurality of devices, unrelated to an operation of backing up data that is stored in the first memory to the second memory, to the sleep mode or the off mode, when a remaining capacity of the battery is smaller than the reference capacity.

5. The memory module according to claim 2, wherein the mode set unit is configured to set or change at least one of the plurality of voltage generator which supplies a power supply voltage to a device, among a plurality of devices, unrelated to data storage capability, to the sleep mode or the off mode, when a remaining capacity of the battery is smaller than the reference capacity.

6. The memory module according to claim 2,
   wherein the devices further include:
   an RCD; and
   a data buffer, and
   wherein the mode set unit is configured to set or change at least one of the plurality of voltage generators, which supplies power supply voltages to the RCD and the data buffer, to the sleep mode or the off mode, when a remaining capacity of the battery is smaller than a reference capacity.

7. The memory module according to claim 2, wherein the mode set unit is configured to set or change, when the controller performs an operation requiring only some of the plurality of devices, at least one of the plurality of voltage generator, which supplies a power supply voltage to a device, among a plurality of devices, not required by the controller, to the sleep mode or the off mode.

8. The memory module according to claim 1, wherein the controller is configured to determine priorities of data which are stored in the first memory and are to be backed up to the second memory, based on remaining battery capacity information.

9. The memory module according to claim 8, wherein the controller is configured to determine priorities of the data in an order of metadata, map data, and user data.

10. An electronic system comprising:
    a module controller; and
    a memory module,
    the memory module comprising:
    a battery;
    a plurality of devices including a first memory, a second memory, and a controller; and
    a power management integrated circuit configured to adjust a level of a battery power, received from the battery, and configured to supply a power supply voltage to each of the plurality of devices,
    wherein the battery, the plurality of devices, and the power management integrated circuit are mounted on a single module substrate.

11. The electronic system according to claim 10, wherein the power management integrated circuit comprises:
    a plurality of voltage generators, each corresponding to one of the plurality of devices, and each configured to adjust a level of the battery power to supply a power supply voltage to its corresponding device; and
    a mode set unit configured to set or change modes of the voltage generators to one of an active mode, a sleep mode and an off mode.

12. The electronic system according to claim 11, wherein the mode set unit is configured to set or change at least one of the plurality of voltage generators to the sleep mode or the off mode, when a remaining capacity of the battery is smaller than a reference capacity.

13. The electronic system according to claim 11, wherein the mode set unit is configured to set or change at least one of the plurality of voltage generator, which supplies a power supply voltage to a device, among the plurality of devices, unrelated to an operation of backing up data that is stored in the first memory to the second memory, to the sleep mode or the off mode, when a remaining capacity of the battery is smaller than the reference capacity.

14. The electronic system according to claim 11, wherein the mode set unit is configured to set or change at least one of the plurality of voltage generator which supplies a power supply voltage to a device, among a plurality of devices, unrelated to data storage capability, to the sleep mode or the off mode, when a remaining capacity of the battery is smaller than the reference capacity.

15. The electronic system according to claim 11,
    wherein the devices further include:
    an RCD; and
    a data buffer, and
    wherein the mode set unit is configured to set or change at least one of the plurality of voltage generators, which supplies power supply voltages to the RCD and the data buffer, to the sleep mode or the off mode, when a remaining capacity of the battery is smaller than a reference capacity.

16. The electronic system according to claim 11, wherein the mode set unit is configured to set or change, when the controller performs an operation requiring only some of the plurality of devices, at least one of the plurality of voltage generator which supplies a power supply voltage to a device, among a plurality of devices, not required by the controller, to the sleep mode or the off mode.

17. The electronic system according to claim 10, wherein the controller is configured to determine priorities of data which are stored in the first memory and are to be backed up to the second memory, based on remaining battery capacity information.

18. The electronic system according to claim 17, wherein the controller is configured to determine priorities of the data in an order of metadata, map data and user data.

19. A memory module comprising:
a battery;
a plurality of devices including a plurality of first memories, a second memory, and a controller; and
a power management integrated circuit,
wherein the power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for memories,
wherein the battery, the plurality of devices, and the power management integrated circuit are mounted on a single module substrate.

20. The memory module according to claim 19,
wherein the plurality of devices further includes an SPD (serial presence detector), and
wherein the SPD includes a register which stores the optimal power supply voltage information for memories.

21. The memory module according to claim 19, wherein each of the first memories includes a register which stores the optimal power supply voltage information for memories.

22. The memory module according to claim 19, further comprising:
a test circuit configured to execute a self-test algorithm to obtain the optimal power supply voltage information for memories.

23. The memory module according to claim 22, wherein the test circuit is included in each of the first memories and the controller.

24. An electronic system comprising:
a module controller; and
a memory module,
the memory module comprising:
a battery;
a plurality of devices including a plurality of first memories, a second memory, and a controller; and
a power management integrated circuit,
wherein the power management integrated circuit is configured to receive battery power from the battery, configured to supply a power supply voltage to each of the first memories by adjusting a level of the battery power, and configured to adjust a level of the power supply voltage individually for each first memory based on an optimal power supply voltage information for memories,
wherein the battery, the plurality of devices, and the power management integrated circuit are mounted on a single module substrate.

25. The electronic system according to claim 24,
wherein the plurality of devices further includes an SPD (serial presence detector), and
wherein the SPD includes a register which stores the optimal power supply voltage information for memories.

26. The electronic system according to claim 25, wherein the module controller is configured to read the optimal power supply voltage information for memories, which is stored in the SPD, and configured to control the power management integrated circuit based on the read information.

27. The electronic system according to claim 24, wherein each of the first memories includes a register which stores the optimal power supply voltage information for memories.

28. The electronic system according to claim 27, wherein the module controller is configured to provide a special command to the memory module and configured to control the power management integrated circuit based on the optimal power supply voltage information for memories, which is received from the first memories as a response to the special command.

29. The electronic system according to claim 24, further comprising:
a test circuit configured to execute a self-test algorithm to obtain the optimal power supply voltage information for memories.

30. The electronic system according to claim 29, wherein the test circuit is included in each of the first memories and the controller.

31. The electronic system according to claim 29, wherein the module controller is configured to control the power management integrated circuit based on the optimal power supply voltage information for memories, which is obtained through the self-test algorithm.

* * * * *